(12) United States Patent
Araumi et al.

(10) Patent No.: US 12,051,964 B2
(45) Date of Patent: Jul. 30, 2024

(54) CURRENT DETECTION CIRCUIT INCLUDING NON-LINEAR CIRCUIT AND POWER SUPPLY CIRCUIT CONTAINING THE SAME

(71) Applicant: FUJI ELECTRIC CO., LTD., Kawasaki (JP)

(72) Inventors: Ryuunosuke Araumi, Tokyo (JP); Ryuji Yamada, Tokyo (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 188 days.

(21) Appl. No.: 17/482,683

(22) Filed: Sep. 23, 2021

(65) Prior Publication Data

US 2022/0173650 A1 Jun. 2, 2022

(30) Foreign Application Priority Data

Nov. 27, 2020 (JP) ................................ 2020-196801

(51) Int. Cl.
*H02M 1/00* (2007.01)
*G01R 15/16* (2006.01)
(Continued)

(52) U.S. Cl.
CPC .......... *H02M 1/0009* (2021.05); *G01R 15/16* (2013.01); *G01R 19/10* (2013.01); *G01R 19/14* (2013.01);
(Continued)

(58) Field of Classification Search
CPC ..... G05F 1/00; G05F 1/10; G05F 1/12; G05F 1/46; G05F 1/455; G05F 1/45;
(Continued)

(56) References Cited

U.S. PATENT DOCUMENTS 5,615,093 A * 3/1997 Nalbant ............. H05B 41/3925
315/307
5,745,322 A 4/1998 Duffy et al.
(Continued)

FOREIGN PATENT DOCUMENTS

EP 1511364 A1 * 3/2005 ......... H05B 41/2813
JP H07274499 A 10/1995
(Continued)

OTHER PUBLICATIONS

CN 112083213, Chinese Patent with English Translation being provided, by Inventor Du Juan, Aug. 2020 (Year: 2020).*
(Continued)

*Primary Examiner* — Thienvu V Tran
*Assistant Examiner* — Nusrat Quddus
(74) *Attorney, Agent, or Firm* — Rabin & Berdo, P.C.

(57) ABSTRACT

A current detection circuit configured to detect a resonant current of a power supply circuit. The power supply circuit includes a resonant circuit that has an inductor and a first capacitor having a first end and a second end. The current detection circuit includes a second capacitor having a first end and a second end, and a non-linear circuit provided between the second end of the second capacitor and the second end of the first capacitor. The first end of the second capacitor is coupled to the first end of the first capacitor.

10 Claims, 17 Drawing Sheets

(51) Int. Cl.
  *G01R 19/10* (2006.01)
  *G01R 19/14* (2006.01)
  *G01R 19/25* (2006.01)
  *H02M 3/335* (2006.01)

(52) U.S. Cl.
  CPC .... *G01R 19/2513* (2013.01); *H02M 3/33571* (2021.05)

(58) Field of Classification Search
  CPC ... G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/575; H02M 5/2573; H02M 1/081; H02M 5/293; H02M 7/12; H02M 3/10; H02M 3/125; H02M 3/13; H02M 3/135; H02M 3/145; H02M 3/15; H02M 3/155; H02M 3/156; H02M 3/158; H02M 3/1588; H02M 2003/1566; H02M 3/1582; H02M 2003/1557; H02M 3/22; H02M 1/08; H02M 1/36; H02M 3/24; H02M 3/325; H02M 3/335; H02M 3/28; H02M 3/33569; H02M 3/33507; H02M 2007/4815; H02M 2007/4818; H02M 1/083; H02M 3/33538; H02M 3/33546; H02M 3/33515; H02M 3/33576; H02M 3/33592; H02M 3/33553; H02M 3/33523; H02M 3/1584; H02M 3/285; H02M 3/33561; H02M 7/49; H02M 1/045; H02M 7/006; H02M 7/06; H02M 7/068; H02M 7/153; H02M 7/10; H02M 1/088; H02M 7/103; H02M 7/106; H02M 7/19; H02M 7/08; H02M 7/17; H02M 2001/007; H02M 7/493; H02M 7/53806; H02M 7/5381; H02M 7/483; H02M 7/217; H02M 7/538466; H02M 7/5387; H02M 7/53871; H02M 7/53873; H02M 7/53875; H02M 1/084; H02M 1/0845; H02M 3/07; H02M 3/073; H02M 2003/071; H02M 2003/072; H02M 2003/075; H02M 2003/076; H02M 2003/077; H02M 2003/078; H02M 2001/0048; H05B 39/048; B23K 11/24; H04B 2215/069; Y02B 70/1491; H02J 3/46; H02J 3/38
  See application file for complete search history.

(56) References Cited

U.S. PATENT DOCUMENTS

| | | | | |
|---|---|---|---|---|
| 5,952,790 A * | 9/1999 | Nerone | ............. | H05B 41/2825 315/307 |
| 6,087,782 A * | 7/2000 | Majid | ..................... | H02M 1/32 315/276 |
| 7,778,048 B2 * | 8/2010 | Hosotani | ........... | H02M 3/33569 363/21.02 |
| 8,842,449 B1 * | 9/2014 | Tong | .................. | H02M 3/3376 363/21.02 |
| 9,929,661 B2 * | 3/2018 | Chen | ...................... | H02M 1/36 |
| 9,960,673 B2 * | 5/2018 | Matsuura | .............. | H02M 3/158 |
| 10,326,377 B1 * | 6/2019 | Xiong | ................... | H05B 45/14 |
| 10,707,763 B1 * | 7/2020 | Xiong | ................... | H05B 45/50 |
| 10,886,854 B2 * | 1/2021 | Huang | ............. | H02M 3/33507 |
| 11,735,994 B2 * | 8/2023 | Matsumoto | ......... | H02M 1/0003 363/21.15 |
| 2009/0115381 A1 * | 5/2009 | Zwerver | ................ | H02M 3/01 323/271 |
| 2012/0020118 A1 * | 1/2012 | Takaki | ............. | H02M 3/33507 363/16 |
| 2012/0188797 A1 * | 7/2012 | Nakanishi | ........ | H02M 3/33507 363/21.02 |
| 2012/0313433 A1 * | 12/2012 | Uno | ........................ | H02M 3/01 307/31 |
| 2013/0250625 A1 * | 9/2013 | Yamaguchi | ......... | H02M 1/4258 363/21.02 |
| 2013/0308347 A1 * | 11/2013 | Sato | .................. | H02M 3/33571 363/21.03 |
| 2014/0112030 A1 * | 4/2014 | Fahlenkamp | ..... | H02M 3/33523 363/21.14 |
| 2014/0376274 A1 * | 12/2014 | Hosotani | ................ | H01F 38/06 363/21.02 |
| 2016/0087543 A1 * | 3/2016 | Jin | .................... | H02M 3/33571 363/21.03 |
| 2016/0248332 A1 * | 8/2016 | Ohtake | ............. | H02M 3/33546 |
| 2016/0329817 A1 * | 11/2016 | Liu | .................... | H02M 3/33573 |
| 2017/0110974 A1 * | 4/2017 | Chen | ...................... | H02M 1/08 |
| 2017/0373592 A1 * | 12/2017 | Takahashi | .............. | H02M 3/07 |
| 2018/0006496 A1 * | 1/2018 | Liu | ......................... | H02J 50/12 |
| 2020/0169175 A1 * | 5/2020 | Chen | ...................... | H02M 1/08 |
| 2021/0111631 A1 * | 4/2021 | Kobayashi | ......... | H02M 1/0035 |
| 2021/0167684 A1 * | 6/2021 | Matsumoto | ............. | H02M 1/32 |
| 2021/0184585 A1 * | 6/2021 | Matsumoto | ....... | H02M 3/33569 |
| 2021/0376738 A1 * | 12/2021 | Araumi | .................... | H02M 3/01 |
| 2022/0021312 A1 * | 1/2022 | Hirokawa | ........... | H02M 1/0058 |
| 2022/0060118 A1 * | 2/2022 | Yoshizawa | .......... | H02M 1/0025 |
| 2022/0149741 A1 * | 5/2022 | Chen | ..................... | G01K 3/005 |
| 2022/0216797 A1 * | 7/2022 | Endo | .................. | H02M 1/4225 |
| 2022/0302824 A1 * | 9/2022 | Araumi | ............. | H02M 3/33571 |
| 2022/0376614 A1 * | 11/2022 | Kobayashi | ............... | H02M 3/01 |
| 2023/0051610 A1 * | 2/2023 | Matsumoto | ....... | H02M 3/33571 |
| 2023/0143191 A1 * | 5/2023 | Endo | ................... | H02M 1/0025 363/21.12 |
| 2023/0253871 A1 * | 8/2023 | Sugawara | ............. | H02M 1/088 363/21.02 |
| 2023/0253872 A1 * | 8/2023 | Tanaka | ................ | H02M 1/0032 363/21.02 |

FOREIGN PATENT DOCUMENTS

| | | |
|---|---|---|
| JP | 2000501277 A | 2/2000 |
| JP | 2000162248 A | 6/2000 |
| JP | 2003-087999 A | 3/2003 |
| JP | 2005-051918 A | 2/2005 |
| JP | 2005-198457 A | 7/2005 |
| JP | 2013-099037 A | 5/2013 |
| JP | 2016-096702 A | 5/2016 |
| WO | 2016/117230 A1 | 7/2016 |

OTHER PUBLICATIONS

KR 20140144360, Koran Patent with English Translation being provided, by Inventor Ahn Tae Young, Oct. 2013 (Year: 2013).*
Japanese Office Action dated Jun. 4, 2024, in the counterpart Patent Application No. 2020-196801.

* cited by examiner

CURRENT DETECTION CIRCUIT INCLUDING NON-LINEAR CIRCUIT AND POWER SUPPLY CIRCUIT CONTAINING THE SAME

CROSS-REFERENCE TO RELATED APPLICATION

The present application claims priority pursuant to 35 U.S.C. §119 from Japanese patent application number 2020-196801 filed on Nov. 27, 2020, the entire disclosure of which is hereby incorporated by reference herein.

BACKGROUND

Technical Field

The present disclosure relates to a current detection circuit and a power supply circuit.

Description of the Related Art

Power supply circuits includes a resonant power supply circuit comprising a resonant circuit (for example, see Japanese Patent Application Publication Nos. 2005-51918, 2005-198457, 2013-99037, and 2016-96702).

In the resonant power supply circuit, for example, when a switching frequency drops below a predetermined resonance frequency, so-called off-resonance may occur and a through current may flow through a switching device. Thus, a control integrated circuit (IC) used in the power supply circuit controls the switching device based on a timing at which the polarity of the resonant current changes, so as to prevent occurrence of off-resonance.

In general, a change in the polarity of the resonant current is detected based on a voltage of a shunt resistor through which the resonant current flows. However, when the resistance value of the shunt resistor is small, a change in the polarity may not be correctly detected. Meanwhile, when the resistance value of the shunt resistor is increased, the polarity of the resonant current can be accurately detected but the power consumption in the shunt resistor increases.

The present disclosure is directed to provision of a current detection circuit capable of accurately detecting a polarity of a resonant current while reducing power consumption.

SUMMARY

An aspect of the present disclosure is a current detection circuit configured to detect a resonant current of a power supply circuit, the power supply circuit including a resonant circuit that has an inductor, and a first capacitor having a first end and a second end, the current detection circuit comprising: a second capacitor having a first end and a second end, the first end thereof being coupled to the first end of the first capacitor; and a non-linear circuit provided between the second end of the second capacitor and the second end of the first capacitor.

Another aspect of the present disclosure is a power supply circuit configured to generate an output voltage of a target level from an input voltage, the power supply circuit comprising: a resonant circuit including an inductor, and a first capacitor having a first end and a second end; first and second switching devices configured to control a resonant current of the resonant circuit; a current detection circuit configured to detect the resonant current; and an integrated circuit having a first terminal to receive a detection voltage corresponding to the resonant current, and a second terminal to receive a feedback voltage corresponding to the output voltage, the integrated circuit being configured to control switching of the first and second switching devices, wherein the current detection circuit includes a second capacitor having a first end and a second end, the first end thereof being coupled to the first end of the first capacitor, and a non-linear circuit provided between the second end of the second capacitor and the second end of the first capacitor, the current detection circuit being configured to output a voltage from the second end of the second capacitor as the detection voltage.

BRIEF DESCRIPTION OF THE DRAWINGS

FIG. 2 is a diagram illustrating a current path and a configuration of a current detection circuit 50a.

FIG. 3 is a diagram illustrating a current path and a configuration of a current detection circuit 50a.

FIG. 4 is a diagram illustrating an example of voltage waveforms in a current detection circuit 50a.

DETAILED DESCRIPTION

At least following matters will become apparent from the descriptions of the present specification and the accompanying drawings.

Embodiments

<<<Outline of Switching Power Supply Circuit 10>>>

Figure 1:
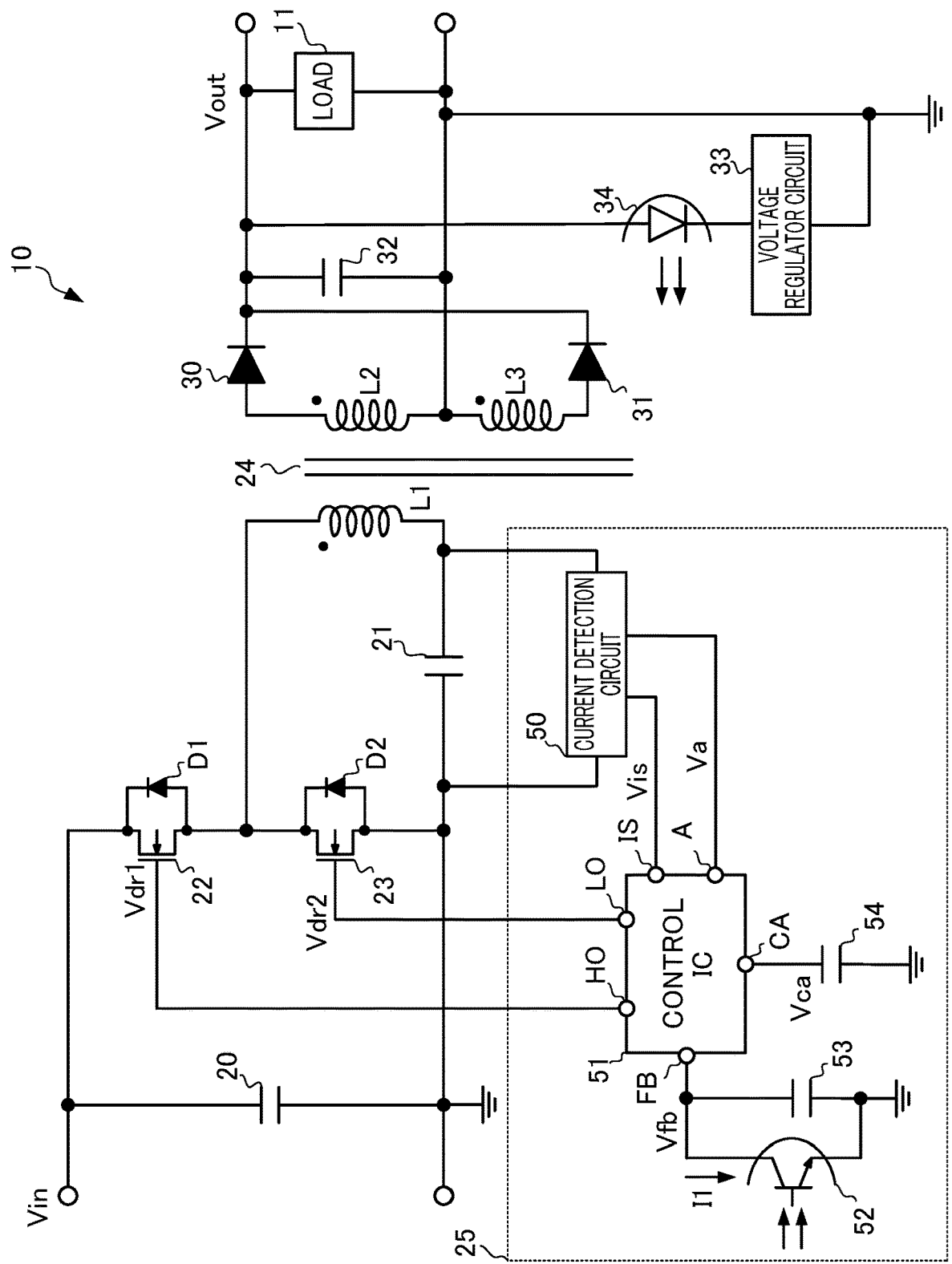
FIG. 1 is a diagram illustrating an example of a switching power supply circuit 10.

FIG. 1 is a diagram illustrating a configuration of a switching power supply circuit 10 which is one embodiment of the present disclosure. The switching power supply circuit 10 is an LLC current resonant converter that generates an output voltage Vout of a target level from a predetermined input voltage Vin and applies the output voltage Vout to a load 11. Note that, in an embodiment of the present disclosure, the input voltage Vin is, for example, 400 V and the output voltage Vout is, for example, 15V.

The switching power supply circuit 10 includes capacitors 20, 21, and 32, N-type metal-oxide-semiconductor (NMOS) transistors 22 and 23, a transformer 24, a control block 25, diodes 30 and 31, a voltage regulator circuit 33, and a light emitting diode 34.

The capacitor 20 stabilizes the voltage between a power supply line to receive the input voltage Vin and a ground line to receive a ground voltage GND, and removes noise and the like.

The capacitor 21 is a so-called resonant capacitor that configures a resonant circuit with a primary coil L1 and a leakage inductance of the transformer 24. Note that illustration of the leakage inductance is omitted in FIG. 1. Note that the capacitor 21 corresponds to a "first capacitor".

The NMOS transistor 22 is a high-side power transistor and the NMOS transistor 23 is a low-side power transistor. Note that the NMOS transistor 22 corresponds to a "first switching device" and the NMOS transistor 23 corresponds to a "second switching device".

A diode D1 is a body diode of the NMOS transistor 22 and a diode D2 is a body diode of the NMOS transistor 23. The diodes D1 and D2 operate as so-called freewheeling diodes.

Although the NMOS transistors 22 and 23 are used as the switching devices in an embodiment of the present disclosure, for example, P-type metal-oxide-semiconductor (PMOS) transistors or bipolar transistors may be used as the switching devices. When the bipolar transistors are used as the switching devices, it is only needed to provide external diodes that function as the freewheeling diodes.

The transformer 24 includes the primary coil L1 and secondary coils L2 and L3. The primary coil L1 is insulated from the secondary coils L2 and L3. In the transformer 24, voltages are generated in the secondary coils L2 and L3 on the secondary side according to a variation in a voltage across the primary coil L1 on the primary side. Note that each of the primary coil L1 and the secondary coils L2 and L3 is an "inductor".

Moreover, the primary coil L1 has one end coupled to a source of the NMOS transistor 22 and a drain of the NMOS transistor 23, and the other end coupled to a source of the NMOS transistor 23 through the capacitor 21.

Accordingly, when switching of the NMOS transistors 22 and 23 are started, the voltages of the secondary coils L2 and L3 vary. The primary coil L1 and the secondary coils L2 and L3 are electromagnetically coupled with the same polarity.

The control block 25 is a circuit block that controls the switching of the NMOS transistors 22 and 23, and the details thereof will be described later.

The diodes 30 and 31 rectifies the voltages of the secondary coils L2 and L3, and the capacitor 32 smooths the rectified voltage. As a result, the smoothed output voltage Vout is generated in the capacitor 32. Note that the output voltage Vout results in a direct-current voltage of the target level.

The voltage regulator circuit 33 generates a constant direct-current voltage, and is configured using, for example, a shunt regulator.

The light emitting diode 34 is an element that emits light with an intensity corresponding to a difference between the output voltage Vout and an output of the voltage regulator circuit 33, and configures a photocoupler with a phototransistor 52 which will be described later. In an embodiment of the present disclosure, when the level of the output voltage Vout increases, the intensity of the light from the light emitting diode 34 increases.

<<<Control Block 25>>>

The control block 25 includes a current detection circuit 50, a control IC 51, the phototransistor 52, and capacitors 53 and 54.

<<Current Detection Circuit 50>>

The current detection circuit 50 receives a resonant current generated by the primary coil L1 and the capacitor 21, and outputs a voltage Vis corresponding to a current value of the resonant current and a voltage Va used to detect a direction (polarity) of a flow of the resonant current. Note that the voltage Va of the current detection circuit 50 corresponds to a "detection voltage".

Figure 2:
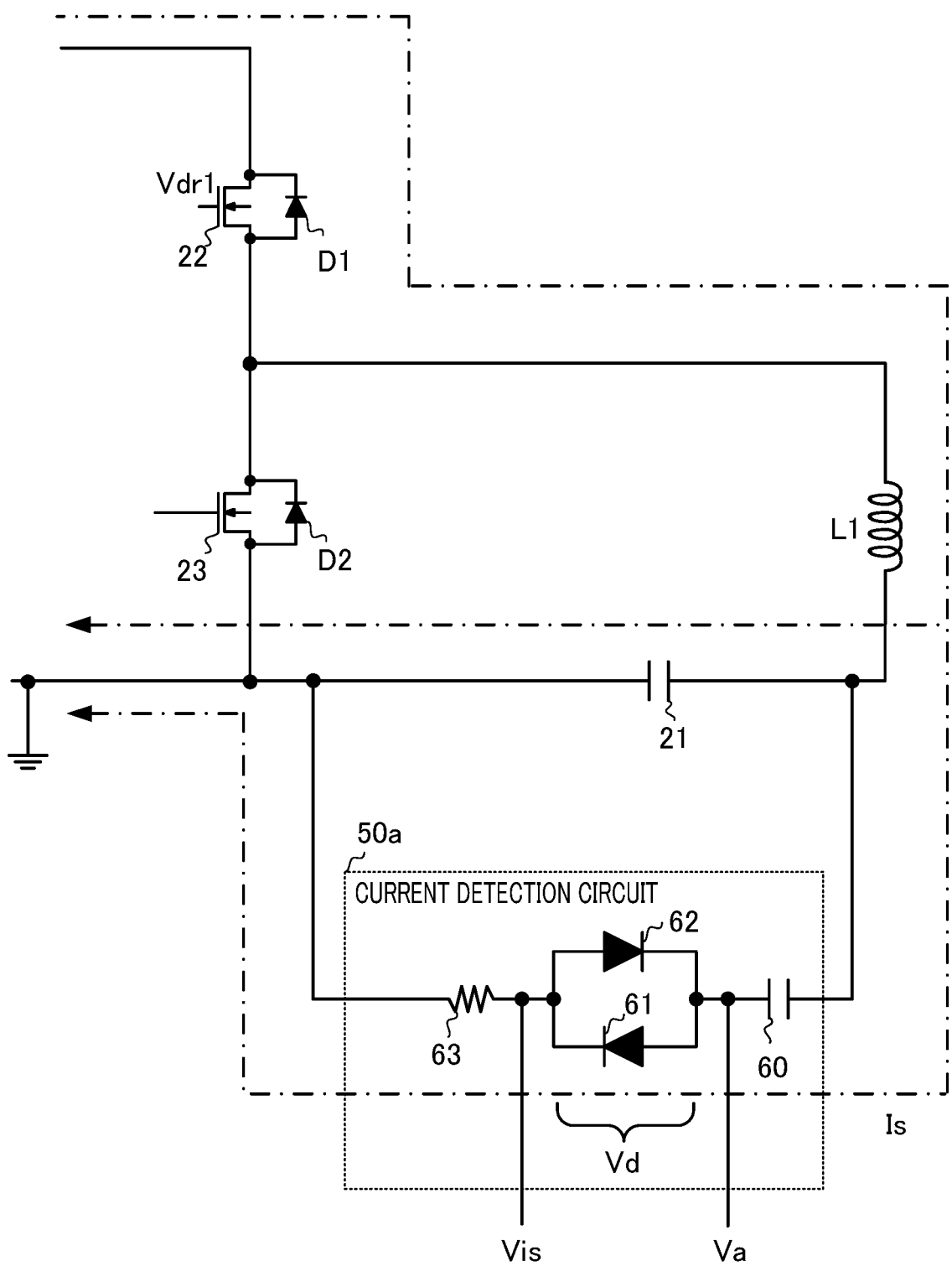
Figure 3:
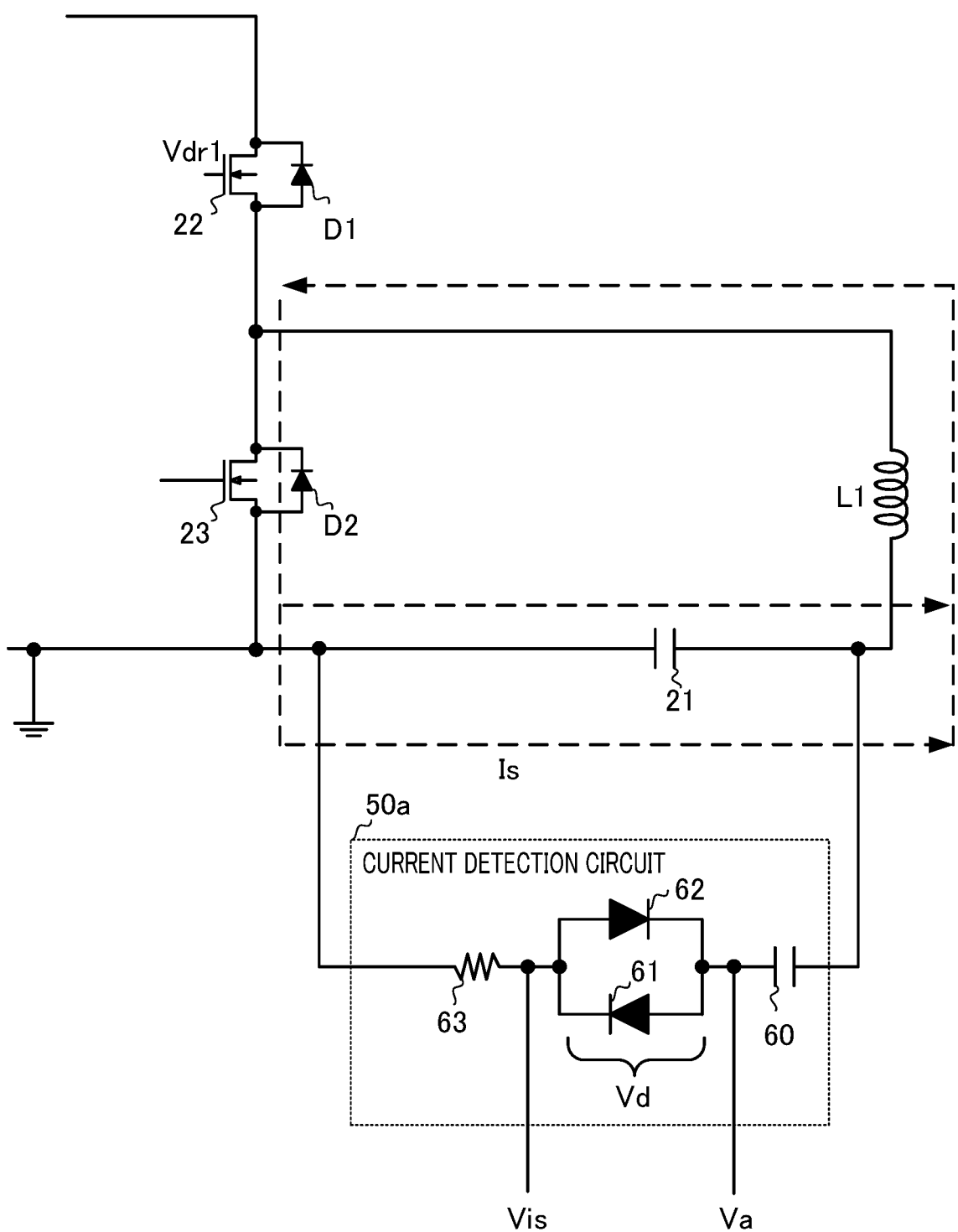

FIGS. 2 and 3 are diagrams illustrating a current path and a current detection circuit 50a which is a first embodiment of the current detection circuit. In an embodiment of the present disclosure, when the NMOS transistor 22 is turned on and the NMOS transistor 23 is turned off, the resonant current flows from the NMOS transistor 22 to the capacitor 21 and the current detection circuit 50a through the primary coil, as illustrated by dashed-dotted lines in FIG. 2.

Meanwhile, when the NMOS transistor 22 is turned off and the NMOS transistor 23 is turned on, the resonant current circulates through the NMOS transistor 23, the capacitor 21, the current detection circuit 50a, and the primary coil, as illustrated by dotted lines in FIG. 3.

Note that, in an embodiment of the present disclosure, the direction of the resonant current illustrated in FIG. 2, in other words, the direction of the current flowing from the primary coil to the capacitor 21, is referred to as "positive direction". Meanwhile, the direction of the resonant current illustrated in FIG. 3, in other words, the direction of the current flowing from the capacitor 21 to the primary coil is referred to as "negative direction".

As illustrated in FIGS. 2 and 3, the current detection circuit 50a detects a current Is obtained by dividing the resonant current, and includes a capacitor 60, diodes 61 and 62, and a resistor 63.

The capacitor 60 is an element that divides the resonant current while protecting the current detection circuit 50a from a high voltage generated in the primary coil. The capacitor 60 has one end coupled to one end of the capacitor 21. The diode 61 is a non-linear element coupled in series with the capacitor 60 such that the current Is will flow in the positive direction. The diode 61 has an anode coupled to the capacitor 60 and a cathode coupled to the resistor 63.

The diode 62 is a non-linear element coupled in anti-parallel with the diode 61 such that the current Is will flow in the negative direction. The diode 62 has an anode coupled to the resistor 63 and a cathode coupled to the capacitor 60.

Note that "anti-parallel coupling" refers to a state in which two diodes are coupled to each other with a forward direction of one diode being opposite to a forward direction of the other diode. Accordingly, when the two diodes are coupled in anti-parallel with each other, a current flows in the positive and negative directions.

The resistor 63 is a shunt resistor that generates a voltage Vis corresponding to the current value of the current Is. Note that, in an embodiment of the present disclosure, a forward voltage of the diodes 61 and 62 is referred to as voltage Vf. Moreover, a voltage at a node at which the anode of the diode 61 (cathode of the diode 62) and the capacitor 60 are coupled is referred to as voltage Va. Furthermore, the capacitor 60 corresponds to a "second capacitor", the diode 61 corresponds to a "first diode", the diode 62 corresponds to a "second diode", and the resistor 63 corresponds to a "first resistor".

Figure 4:
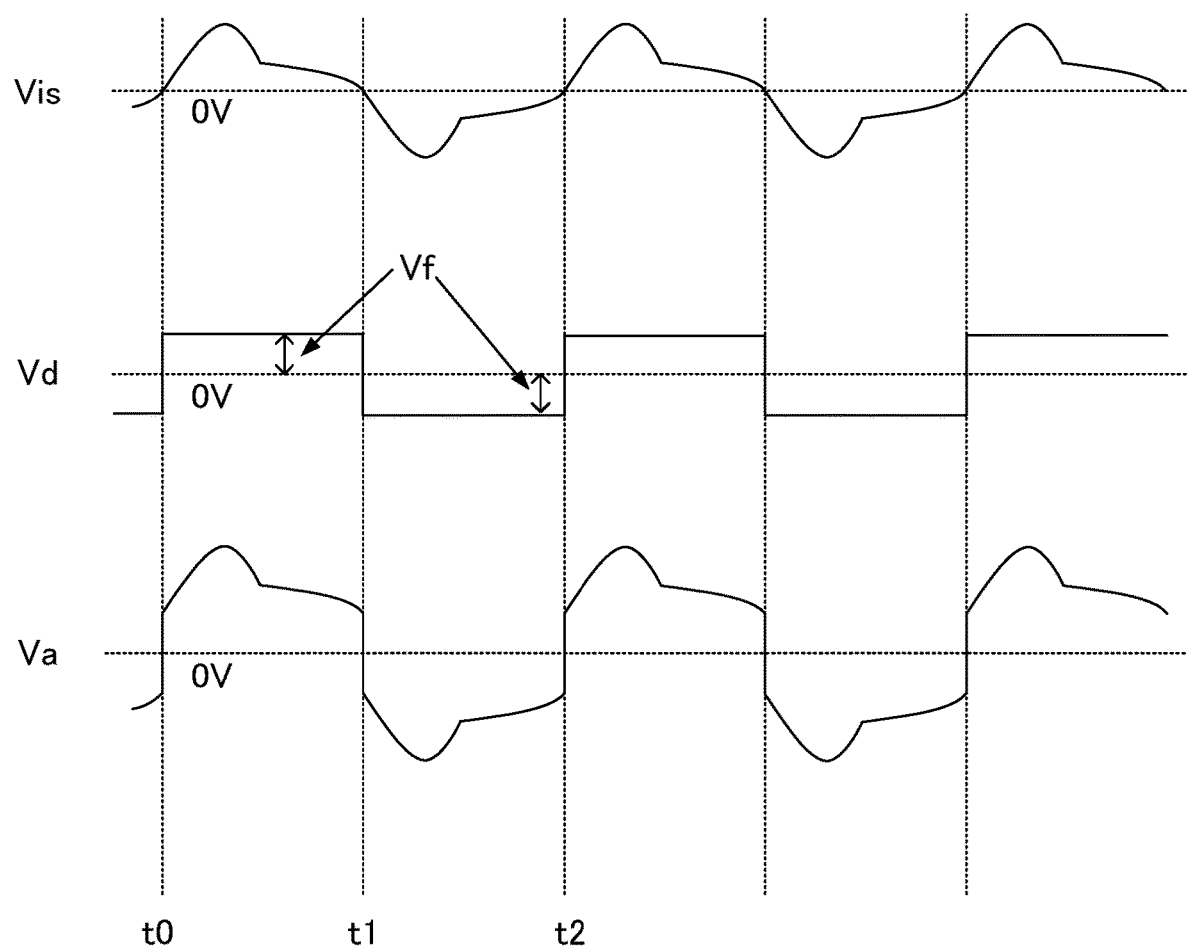

FIG. 4 is a diagram illustrating an example of voltage waveforms in the case where the current Is flows in the current detection circuit 50a. For example, when the NMOS transistor 22 is turned on and the NMOS transistor 23 is turned off at time t0, the current Is in the positive direction illustrated in FIG. 2 flows in the current detection circuit 50a. As a result, the positive voltage Vis corresponding to the current Is and a resistance value of the resistor 63 is generated in the resistor 63.

In this case, the diode 61 out of the diodes 61 and 62 is turned on. Accordingly, a voltage Vd of the anode of the diode 61 with respect to the cathode of the diode 61 is the positive voltage Vf. Accordingly, the voltage Va at the node at which the anode of the diode 61 and the capacitor 60 are coupled is a voltage (Vis+Vf) which is the sum of the voltage Vis and the voltage Vf.

Next, for example, when the NMOS transistor 22 is turned off and the NMOS transistor 23 is turned on at time t1, the current Is in the negative direction illustrated in FIG. 3 flows in the current detection circuit 50a. Thus, the negative voltage Vis corresponding to the current Is and the resistance value of the resistor 63 is generated in the resistor 63.

In this case, the diode 62 out of the diodes 61 and 62 is turned on. Accordingly, the voltage Vd results in the negative voltage Vf and the voltage Va thus becomes a negative voltage (−(Vis+Vf)). Moreover, when the NMOS transistor 22 is turned on again at time t2, the positive current similar to that at time t0 flows. Accordingly, operations of time t0 to time t2 are repeated at and after time t2.

As apparent from FIG. 4, at timings (e.g., time t1 and time t2) at which the polarity of the current Is changes, a change width in which the voltage Va changes is greater than a change width in which the voltage Vis changes. Thus, the current detection circuit 50a can accurately detect a change in the polarity of the resonant current. Moreover, the control IC 51 detects the polarity of the resonant current not based on the voltage Vis but based on the voltage Va with a greater change width, which will be described later in detail. Thus, the control IC 51 can control the NMOS transistors 22 and 23 based on an accurately-detected change in the polarity of the resonant current.

<<Control IC 51>>

The control IC 51 is an integrated circuit that controls the switching of the NMOS transistors 22 and 23, and has terminals FB, A, IS, CA, HO, and LO.

The terminal FB is to receive a feedback voltage Vfb corresponding to the output voltage Vout, and is coupled to the phototransistor 52 and the capacitor 53. The phototransistor 52 causes a bias current I1 having a magnitude corresponding to the intensity of the light from the light emitting diode 34 to flow from the terminal FB to the ground. Accordingly, the phototransistor 52 operates as a transistor that generates a sink current. The capacitor 53 is provided to remove noise between the terminal FB and the ground.

The terminal A is to receive the voltage Va from the current detection circuit 50a, and the terminal IS is to receive the voltage Vis from the current detection circuit 50a.

Incidentally, the current value of the resonant current changes depending on input power of the switching power supply circuit 10. The input power of the switching power supply circuit 10 changes with power consumed in the load 11, in other words, a current (hereinafter, referred to as "load current") flowing through the load 11 when the output voltage Vout is at the target level. Accordingly, the resonant current changes with the load current.

The terminal CA is to receive a voltage Vca corresponding to the magnitude of the input power of the switching power supply circuit 10, in other words, the load current. The capacitor 54 is coupled to the terminal CA, which will be described later in detail.

The terminal HO is a terminal from which a drive signal Vdr1 for driving the NMOS transistor 22 is to be outputted, and to which a gate of the NMOS transistor 22 is coupled. The terminal LO is a terminal from which a drive signal Vdr2 for driving the NMOS transistor 23 is to be outputted, and to which a gate of the NMOS transistor 23 is coupled.

Note that, in an embodiment of the present disclosure, the terminal A of the control IC 51 corresponds to a "first terminal", the terminal FB of the control IC 51 corresponds to a "second terminal", and the terminal IS of the control IC 51 corresponds to a "third terminal".

<<Details of Control IC 51>>>

Resistor 70 and Feedback Voltage Vfb

Figure 5:
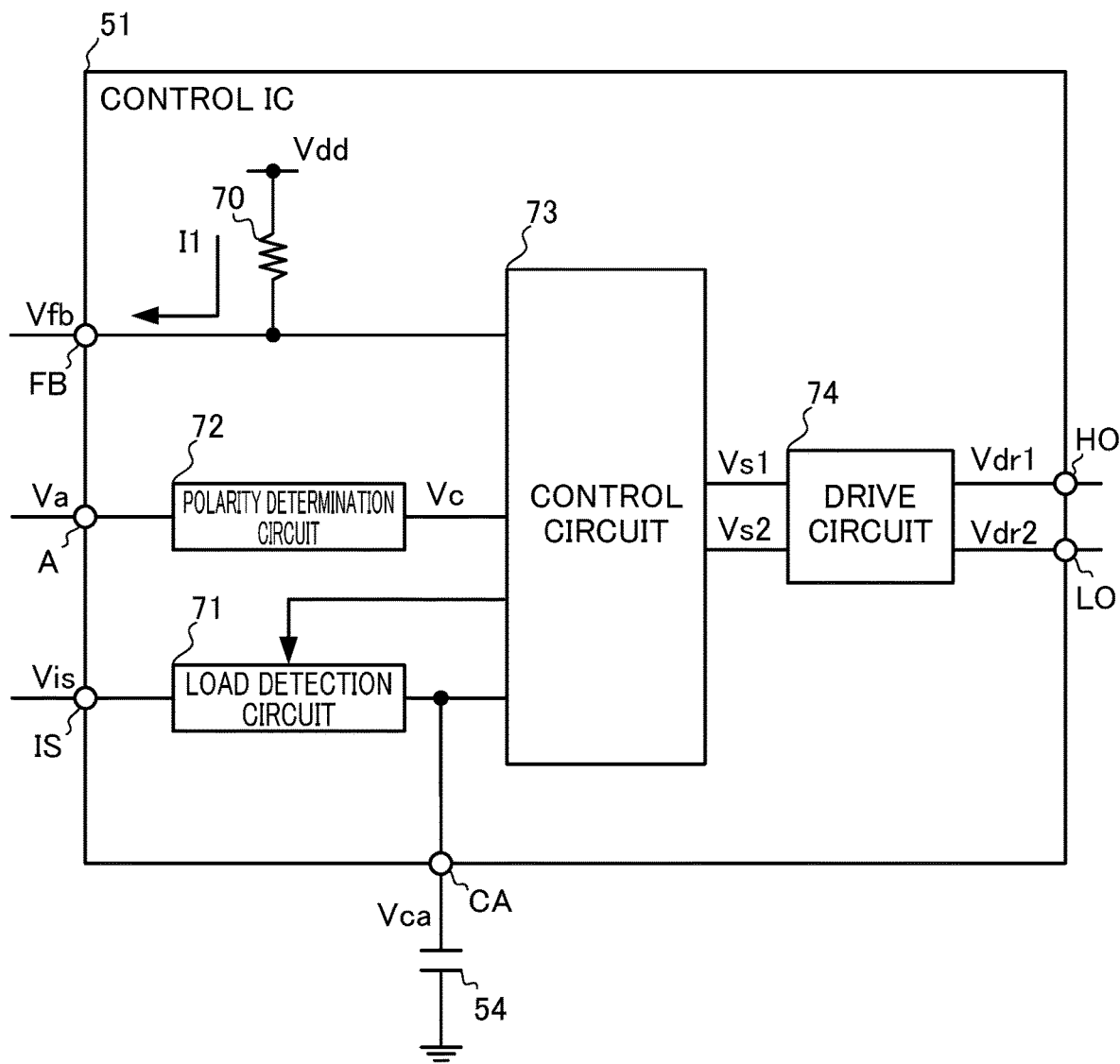
FIG. 5 is a diagram illustrating a configuration of a control IC 51.

FIG. 5 is a diagram illustrating a configuration of the control IC 51. The control IC 51 includes a resistor 70, a load detection circuit 71, a polarity determination circuit 72, a control circuit 73, and a drive circuit 74. The resistor 70 generates the feedback voltage Vfb based on the bias current I1 from the phototransistor 52. The resistor 70 has one end to receive a predetermined power supply voltage Vdd and the other end coupled to the terminal FB. Accordingly, the feedback voltage Vfb generated at the terminal FB is expressed by Formula 1):

$$Vfb = Vdd - R \times I1 \quad \quad 1)$$

where a resistance value of the resistor 70 is "R".

As described above, in an embodiment of the present disclosure, the current value of the bias current I1 increases with a rise in the output voltage Vout. Accordingly, when the output voltage Vout rises, the feedback voltage Vfb drops.

Load Detection Circuit 71

The load detection circuit 71 outputs the voltage Vca corresponding to the power consumption of the load 11. Specifically, the load detection circuit 71 integrates the voltage Vis that is based on the current Is in the positive direction, with the capacitor 54 coupled to the terminal CA, and outputs the resultant voltage as the voltage Vca. The load detection circuit 71 obtains the voltage Vis in a period of time during which the NMOS transistor 22 is on as the voltage Vis that is based on the current Is in the positive direction, in response to an instruction from the control circuit 73 (described later).

Note that, as described above, the current value of the resonant current of the primary coil L1 increases with the input power of the switching power supply circuit 10. Moreover, the input power of the switching power supply circuit 10 increases with the power consumed in the load 11. Accordingly, the voltage Vca applied to the terminal CA rises with an increase in the power consumption of the load 11. Note that the voltage Vca of the load detection circuit 71 corresponds to a "result of a detection".

Polarity Determination Circuit 72

Figure 6:
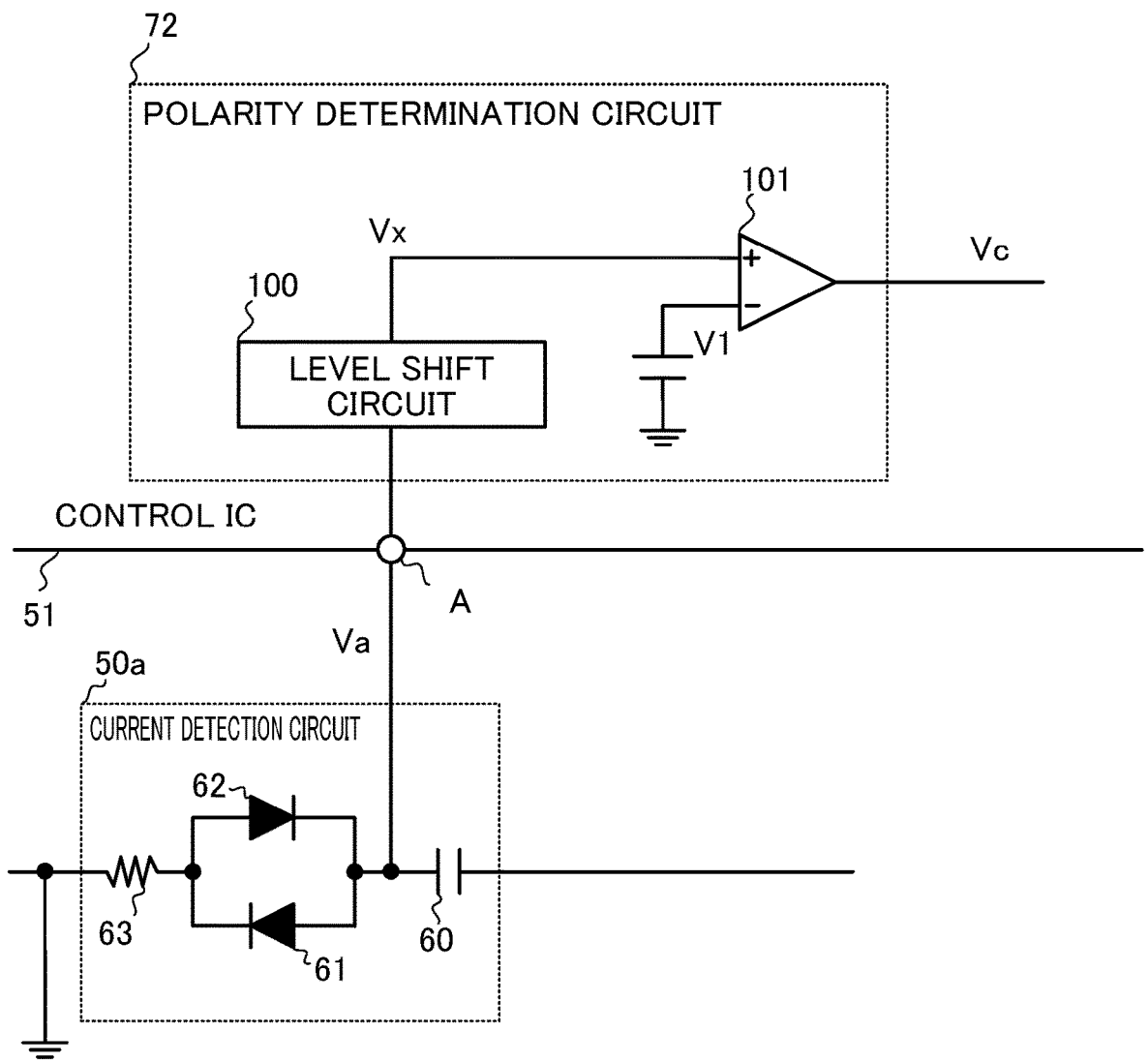
FIG. 6 is a diagram illustrating an example of a polarity determination circuit 72.

The polarity determination circuit 72 determines the polarity of the resonant current based on the voltage Va. As illustrated in FIG. 6, the polarity determination circuit 72 includes a level shift circuit 100 and a comparator 101.

The level shift circuit 100 shifts the level of the voltage Va that changes about 0 V (zero volt), and outputs the resultant voltage as a voltage Vx. The level shift circuit 100 shifts the level of the voltage Va such that the center level of the voltage Va is a predetermined level. Here, the "predetermined level" is, for example, a level (Vdd/2=2.5 V) that is a half of the predetermined power supply voltage Vdd (e.g., 5 V) generated in the control IC 51. The level shift circuit 100 includes, for example, a buffer circuit (or an inverting amplifier circuit) and a voltage divider circuit in which the power supply voltage Vdd is applied to the high voltage side and the voltage Va is applied to the low voltage side.

The comparator 101 determines the polarity of the current Is based on the voltage Vx. Specifically, the comparator 101 compares the voltage Vx with a voltage V1 (e.g., V1=Vdd/2(=2.5 V)) that is the center level of the voltage Vx. Upon the voltage Vx exceeding the voltage V1, the comparator 101 outputs a high-level (hereinafter, high or high-level) voltage Vc indicating that the current Is flows in the positive direction. Meanwhile, upon the voltage Vx dropping below the voltage V1, the comparator 101 outputs a low-level (hereinafter, low or low-level) voltage Vc indicating that the current Is is flowing in the negative direction.

Figure 7:
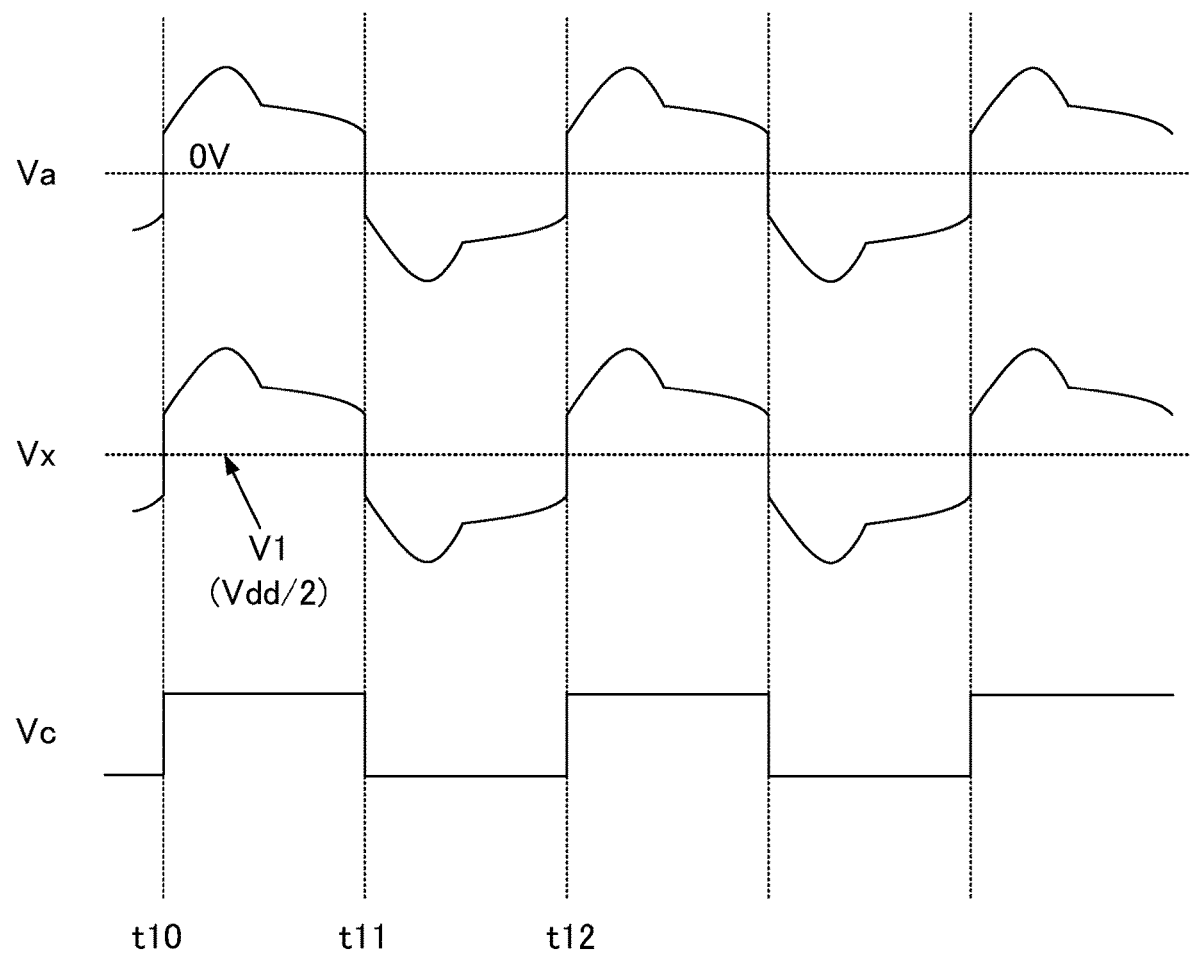
FIG. 7 is a diagram illustrating an example of voltage waveforms in a polarity determination circuit 72.

FIG. 7 is a diagram for explaining an example of an operation of the polarity determination circuit 72. It is assumed here that the current Is in the negative direction is flowing in the current detection circuit 50a before time t10. When the NMOS transistor 22 of FIG. 2 is turned on and the direction of the current Is changes from the negative direction to the positive direction at time t10, the voltage Va becomes positive.

As a result, the level of the voltage Vx from the level shift circuit 100 exceeds the voltage V1 (=Vdd/2) which is the center level. Accordingly, the comparator 101 outputs the high voltage Vc indicating that the positive current Is is flowing.

Then, when the NMOS transistor 23 of FIG. 3 is turned on and the direction of the current Is changes from the positive direction to the negative direction at time t11, the voltage Va becomes negative.

As a result, the level of the voltage Vx from the level shift circuit 100 drops below the voltage V1 (=Vdd/2) which is the center level. Accordingly, the comparator 101 outputs the low voltage Vc indicating that the negative current Is is flowing. As such, the polarity determination circuit 72 can determine the polarity of the current Is based on the voltage Vx (i.e., the voltage Va) that greatly changes in the vicinity of the reversal of the polarity, and output the voltage Vc indicating the result of the determination thereof.

Control Circuit 73 and Drive Circuit 74

The control circuit 73 outputs a signal Vs1 for switching the high-side NMOS transistor 22 and a signal Vs2 for switching the low-side NMOS transistor 23, based on the feedback voltage Vfb, the voltage Vca, and the voltage Vc. The drive circuit 74 is a buffer circuit that outputs the drive signals Vdr1 and Vdr2 of the same logic levels as the logic levels of the signals Vs1 and Vs2, respectively.

Here, the control IC 51 causes the switching power supply circuit 10 to operate in a normal mode when the load current is high, and causes the switching power supply circuit 10 to operate in a burst mode when the load current is low. In this case, the "normal mode" is, for example, a mode in which the switching operation is performed continuously without being intermittently stopped. The "burst mode" is, for example, a mode in which the switching operation is intermittently stopped. Moreover, the "load current is high" is, for example, the case where the current flowing through the load 11 is equal to or higher than a predetermined value (e.g., 1 A) and the "load current is low" is, for example, the case where the current flowing through the load 11 is less than the predetermined value (so-called, light load).

Figure 8:
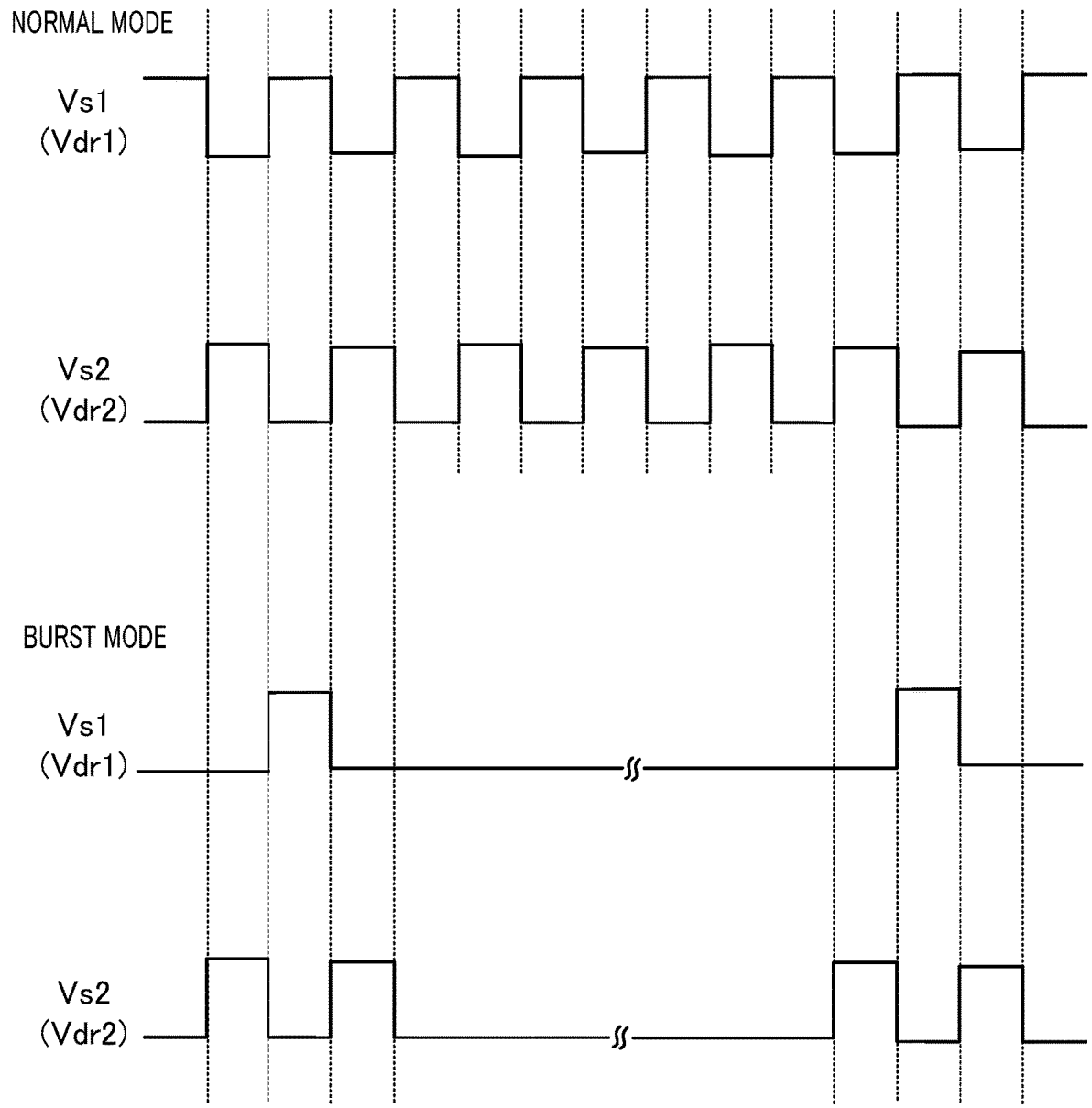
FIG. 8 is a diagram illustrating waveforms of signals Vs1 and Vs2.

The control circuit 73 outputs the signals Vs1 and Vs2 according to the operation mode, based on the voltage Vca that increases with the load current. Specifically, when the voltage Vca exceeds a predetermined level, the control circuit 73 outputs the signals Vs1 and Vs2 with a duty ratio of the high level of 50%, as illustrated in an upper section of FIG. 8. As a result, the switching power supply circuit 10 operates in the normal mode. Note that the signals Vs1 and Vs2 that cause the switching power supply circuit 10 to operate in the "normal mode" are signals with phases opposite to each other. Meanwhile, when the voltage Vca drops below the predetermined level, the control circuit 73 intermittently outputs the signals Vs1 and Vs2, as illustrated in a lower section of FIG. 8. As a result, the switching power supply circuit 10 operates in the burst mode.

Figure 9:
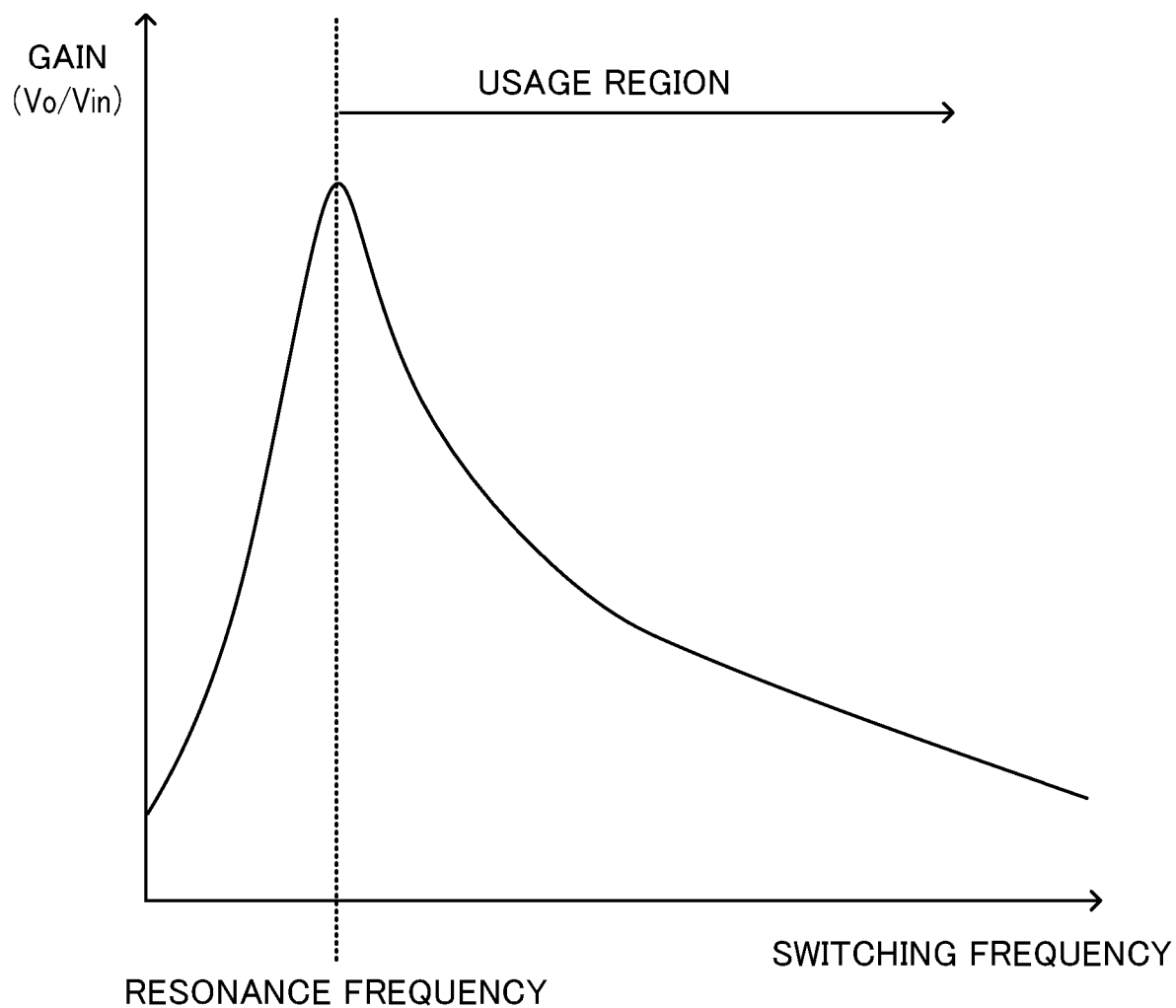
FIG. 9 is a diagram for explaining a relationship between a gain and a switching frequency.

Moreover, the switching power supply circuit 10 is the LLC resonant converter, and thus, for example, a relationship of FIG. 9 is established between the gain (=Vout/Vin) and the switching frequency of the switching power supply circuit 10. In an embodiment of the present disclosure, the switching power supply circuit 10 is designed such that the switching frequency is higher than a predetermined resonance frequency of the switching power supply circuit 10. Note that a "region in which the switching frequency is higher than the predetermined resonance frequency" corresponds to a normal usage region (or an inductive load region) of FIG. 9.

Here, the control circuit 73 changes the frequencies of the signals Vs1 and Vs2 based on the feedback voltage Vfb such that the level of the output voltage Vout reaches the target level. Specifically, the control circuit 73 increases the frequencies of the signals Vs1 and Vs2 when the feedback voltage Vfb rises with the output voltage Vout. As a result, the output voltage Vout of the switching power supply circuit 10 drops.

Meanwhile, the control circuit 73 reduces the frequencies of the signals Vs1 and Vs2 when the feedback voltage Vfb decreases with the output voltage Vout. As a result, the output voltage Vout of the switching power supply circuit 10 increases. Accordingly, the switching power supply circuit 10 can generate the output voltage Vout of the target level.

Incidentally, for example, such a phenomenon, i.e., off-resonance, in which the frequencies of the signals Vs1 and Vs2 drop below the predetermined resonance frequency when the input voltage Vin and the output voltage Vout change, may occur.

For example, when off-resonance occurs in a period of time in which the NMOS transistor 22 is on, the following phenomenon occurs.

Figure 10:
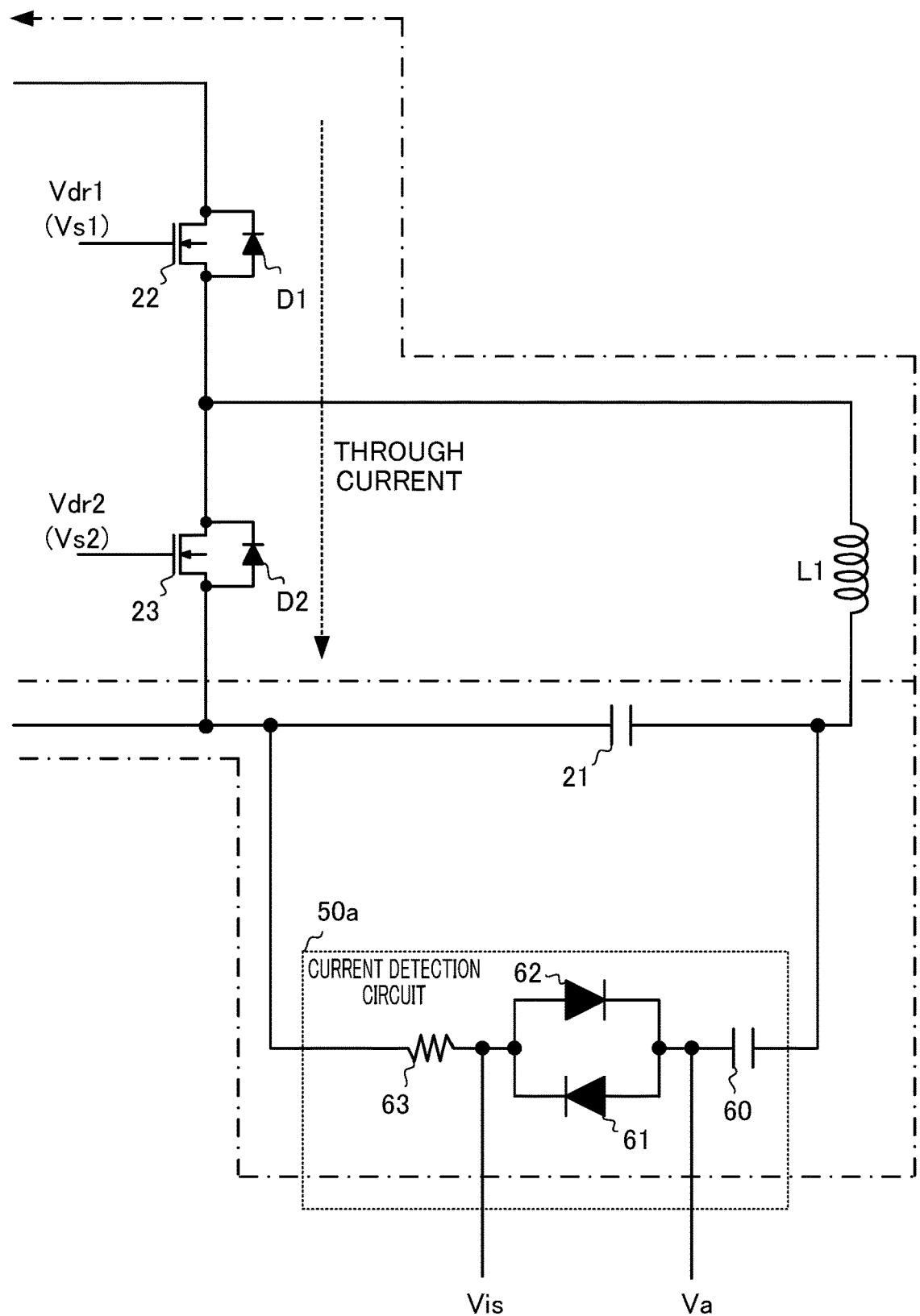
FIG. 10 is a diagram illustrating an example of a flow of a current in off-resonance.

First, as indicated by dashed-dotted lines in FIG. 10, the direction of the resonant current changes from the positive direction to the negative direction, and the resonant current in the negative direction flows through the NMOS transistor 22. Thereafter, when the NMOS transistor 22 is turned off and the NMOS transistor 23 is turned on, a through current flows through the NMOS transistor 23 due to reverse recovery characteristics of the diode D1, as indicated by a dotted line in FIG. 10. Although a phenomenon in which a through current flows in the NMOS transistor 23 is explained in FIG. 10, a similar phenomenon occurs in the NMOS transistor 22 as well when off-resonance occurs.

Thus, the control circuit 73 according to an embodiment of the present disclosure controls periods of time in which the signals Vs1 and Vs2 are high based on the voltage Vc indicating the polarity of the resonant current such that off-resonance does not occur. Specifically, when it is detected that the negative resonant current flows while the signal Vs1 is high, the control circuit 73 changes the level of the signal Vs1 to low.

Meanwhile, when it is detected that the positive resonant current flows while the signal Vs2 is high, the control circuit 73 changes the level of the signal Vs2 to low. This can prevent a current from flowing through the diodes D1 and D2 in an inappropriate period of time, thereby being able to minimize the occurrence of a through current.

<<Current Detection Circuit 50b>>

Figure 11:
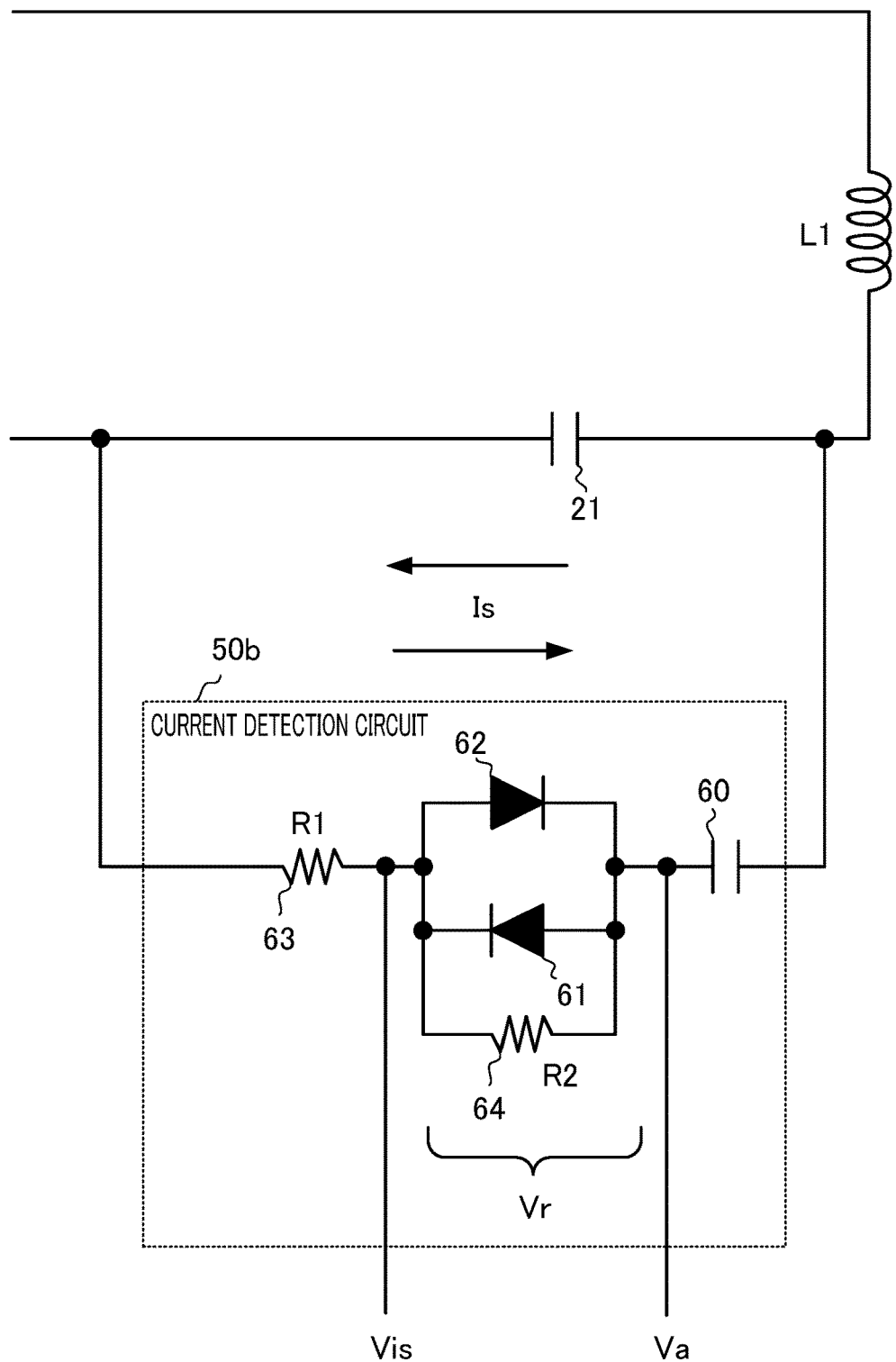
FIG. 11 is a diagram illustrating a configuration of a current detection circuit 50b.

FIG. 11 is a diagram illustrating a current detection circuit 50b, which is a second embodiment of the current detection circuit. Similarly to the current detection circuit 50a, the current detection circuit 50b detects the current Is obtained by dividing the resonant current, and includes the capacitor 60, the diodes 61 and 62, and the resistors 63 and 64.

In the present specification, configurations given the same reference numerals are the same. Thus, the resistor 64 will be described here. The resistor 64 is an element for increasing the voltage Va when the current Is is low, and is coupled in series with the capacitor 60 and the resistor 63, and coupled in parallel with the diodes 61 and 62. Here, the resistance value of the resistor 63 is referred to as R1 and the resistance value of the resistor 64 is referred to as R2. Moreover, it is assumed that the resistance value R2 is greater than the resistance value R1. Note that the resistor 64 corresponds to a "second resistor".

Figure 12:
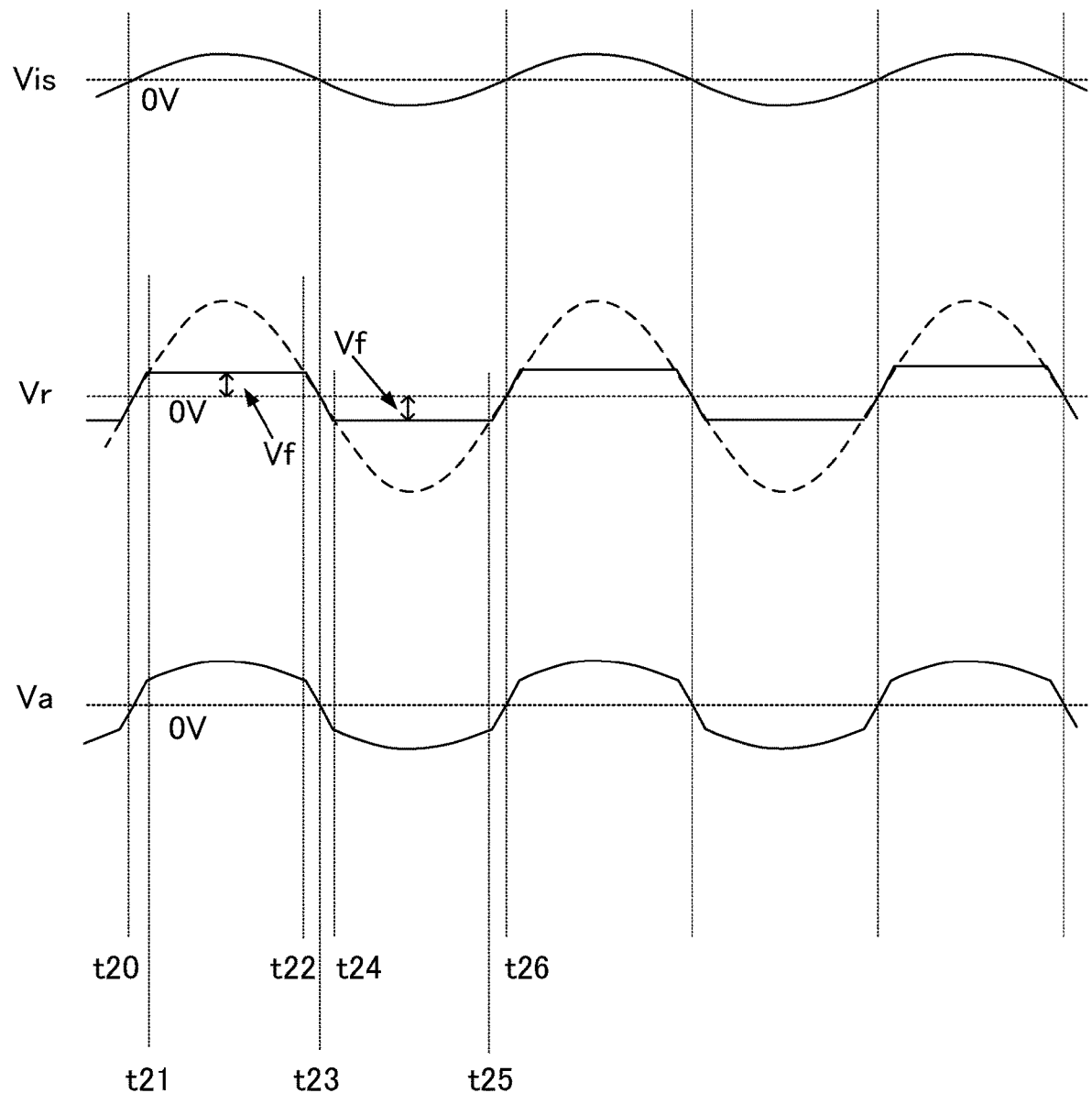
FIG. 12 is a diagram illustrating an example of current s flowing in a current detection circuit 50b.

For example, as illustrated from time t20 to time t21 in FIG. 12, when the positive current Is flowing through the resistor 64 is low and a voltage Vr across the resistor 64 is lower than the voltage Vf of the diode 61, the diode 61 is off. Accordingly, the voltage Va results in a voltage according to the current value of the current Is and a value (=R1+R2) of a combined resistance of the resistors 63 and 64.

Then, for example, from time t21 to time t22, when the current Is flowing through the resistor 64 increases, the voltage Vr across the resistor 64 increases and exceeds the voltage Vf of the diode 61. Accordingly, the diode 61 is turned on, and thus the voltage Va results in the voltage (Vis+Vf) that is equal to the sum of the voltage Vis of the resistor 63 and the voltage Vf of the diode 61, as in the current detection circuit 50a of FIG. 2.

Then, when the positive current Is decreases from time t22 to time t23, the voltage Va results in the voltage according to the current value of the current Is and the value (=R1+R2) of the combined resistance of the resistors 63 and 64, as in the period of time from time t20 to time 21. When the current Is in the negative direction flows in the current detection circuit 50b from time t23 to time t26, the diode 62 is turned on instead of the diode 61 from time t24 to time t25.

As such, in the current detection circuit 50b, even if the current Is is low, the current Is flows through the resistors 63 and 64 coupled in series. Accordingly, a change in the voltage Va can be increased in the vicinity of the point at which the current Is is zero. Moreover, when the current Is is increased, no current Is flows through the resistor 64 which has the large resistance value R2. As a result, the power consumption of the current detection circuit 50b can be reduced.

<<Current Detection Circuit 50c>>

Figure 13:
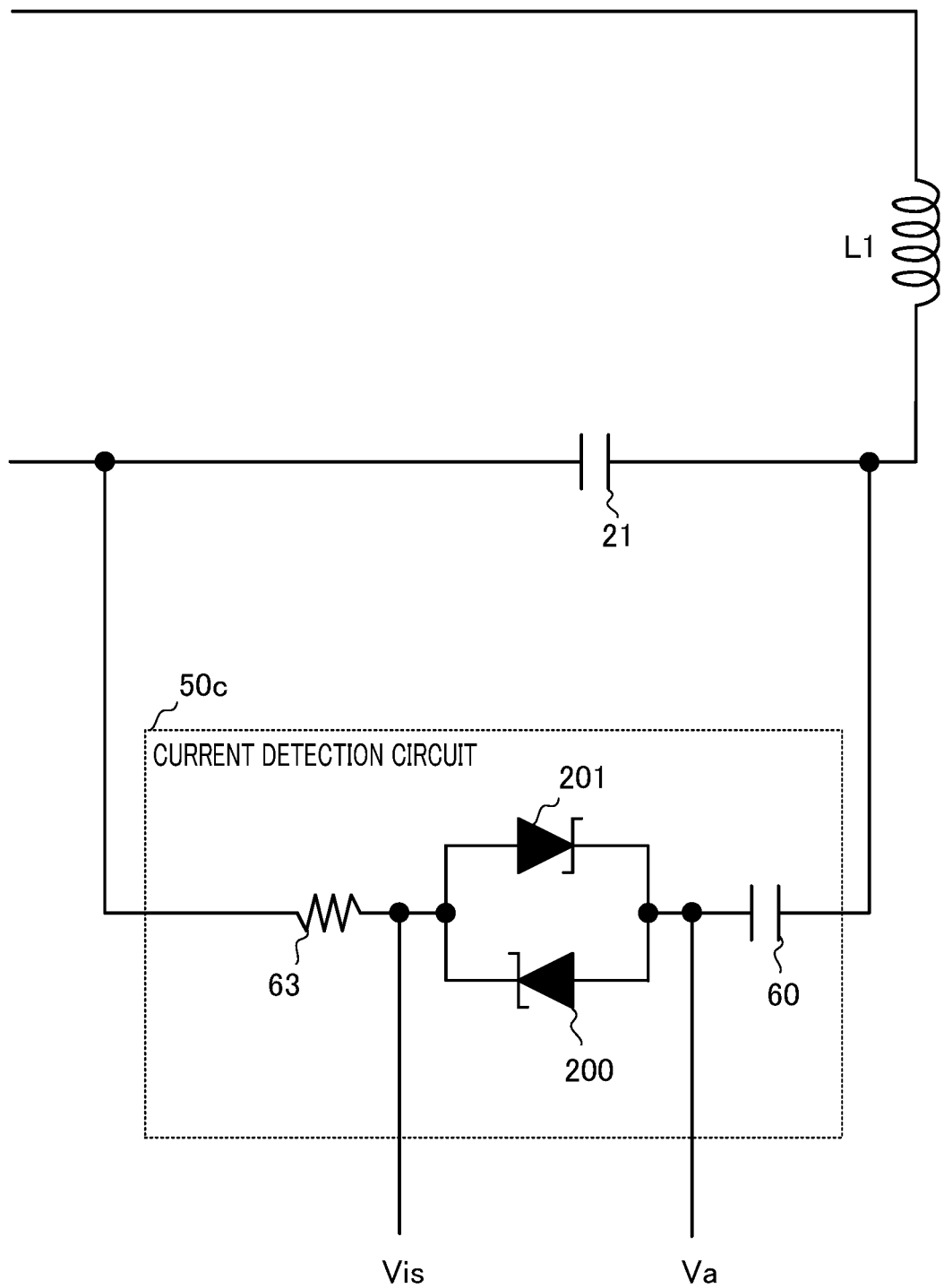
FIG. 13 is a diagram illustrating a configuration of a current detection circuit 50c.

FIG. 13 is a diagram illustrating a current detection circuit 50c, which is a third embodiment of the current detection circuit. Similarly to the current detection circuit 50a, the current detection circuit 50c detects the current Is obtained by dividing the resonant current, and includes the capacitor 60, diodes 200 and 201, and the resistor 63.

When FIGS. 2 and 13 are compared, the current detection circuit 50c uses the diodes 200 and 201 instead of the diodes 61 and 62. The diodes 200 and 201 herein are Zener diodes. Also in the case where the current detection circuit 50c as such is used, a change in the voltage Va can be increased in the vicinity of the point at which the current Is is zero, as in the current detection circuit 50a. Accordingly, the current detection circuit 50c can detect the resonant current with high accuracy.

<<Current Detection Circuit 50d>>

Figure 14:
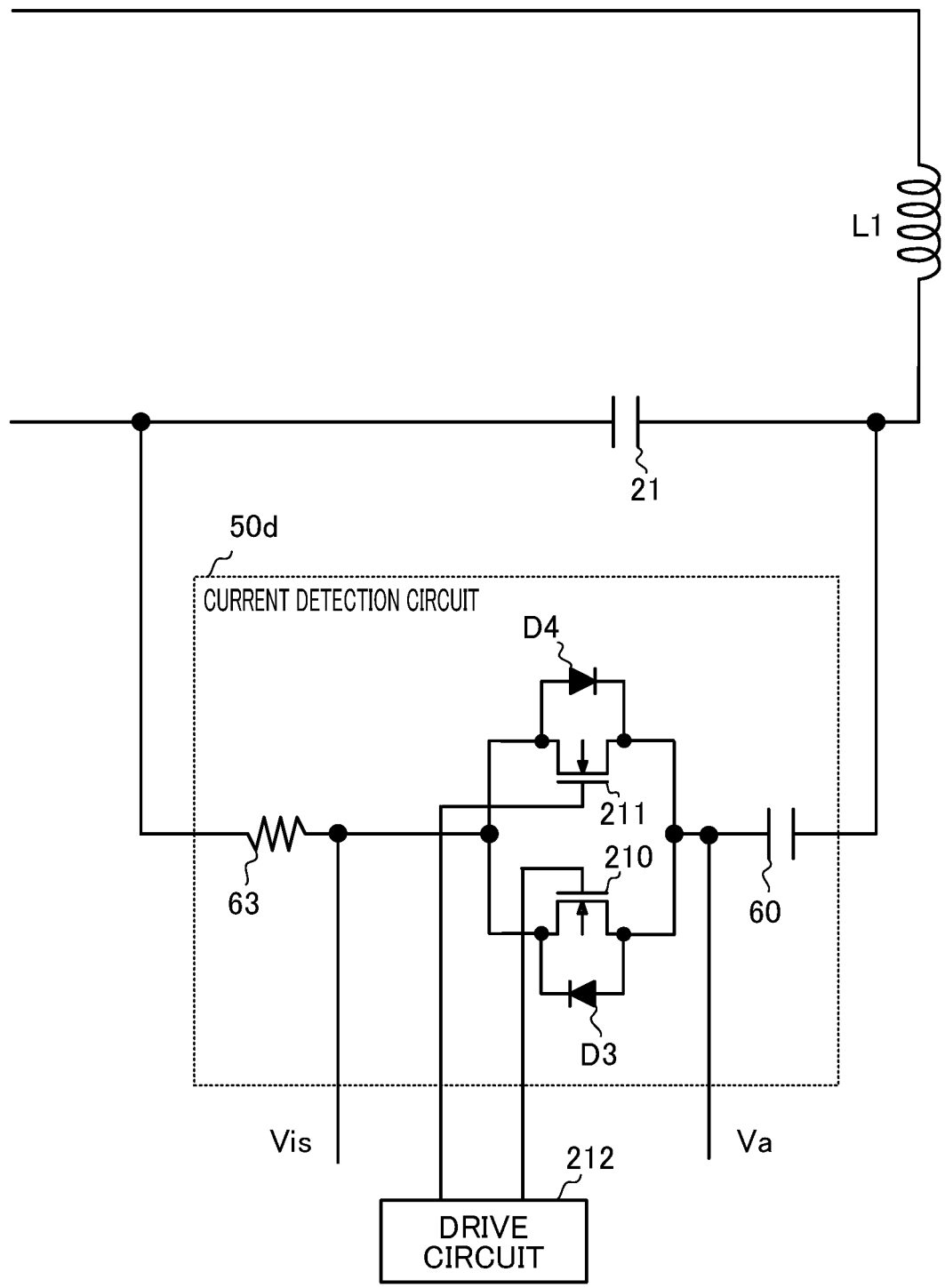
FIG. 14 is a diagram illustrating a configuration of a current detection circuit 50d.

FIG. 14 is a diagram illustrating a current detection circuit 50d, which is a fourth embodiment of the current detection circuit. Similarly to the current detection circuit 50a, the current detection circuit 50d detects the current Is obtained by dividing the resonant current, and includes the capacitor 60, the resistor 63, and NMOS transistors 210 and 211.

Here, when FIGS. 2 and 14 are compared, the current detection circuit 50d uses body diodes D3 and D4 of the respective NMOS transistors 210 and 211, instead of the diodes 61 and 62. Moreover, the NMOS transistors 210 and 211 are turned off by a drive circuit 212. Also in the case where the current detection circuit 50d is used, a change in the voltage Va can be increased in the vicinity of the point at which the current Is is zero, as in the current detection circuit 50a. Accordingly, the current detection circuit 50d can detect the resonant current with high accuracy. Note that the current detection circuit 50d also enables the voltage Va to be made substantially equal to the voltage Vis, with the drive circuit 212 turning on the NMOS transistors 210 and 211.

<<Current Detection Circuit 50e>>

Figure 15:
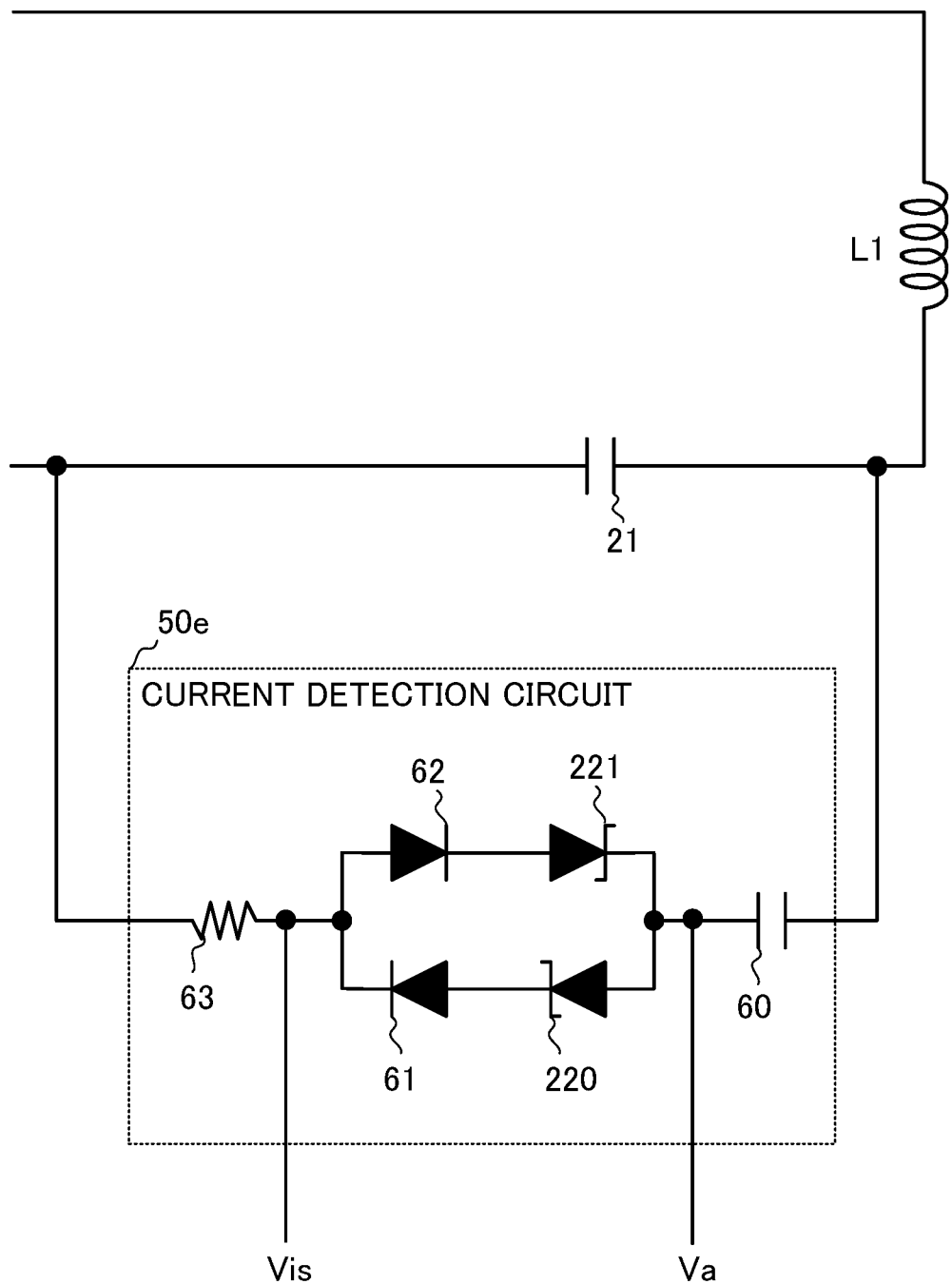
FIG. 15 is a diagram illustrating a configuration of a current detection circuit 50e.

FIG. 15 is a diagram illustrating a current detection circuit 50e, which is a fifth embodiment of the current detection circuit. Similarly to the current detection circuit 50a, the current detection circuit 50e detects the current Is obtained by dividing the resonant current, and includes the capacitor 60, the diodes 61 and 62, diodes 220 and 221, and the resistor 63.

Here, when FIGS. 2 and 15 are compared, in the current detection circuit 50e, the diodes 220 and 221, which are Zener diodes, are coupled in series with the diodes 61 and 62, respectively. The temperature characteristics of the voltage Vf in the diodes 61 and 62 is negative and the temperature characteristics of a forward voltage in the diodes 220 and 221 is positive. Accordingly, with the use of the current detection circuit 50e, it is possible to generate the voltage Va that is independent of temperature while increasing a change in the voltage Va in the vicinity of the point at which the current Is is zero. Note that the diode 220 corresponds to a "first Zener diode" and the diode 221 corresponds to a "second Zener diode".

<<Current Detection Circuit 50f>>

Figure 16:
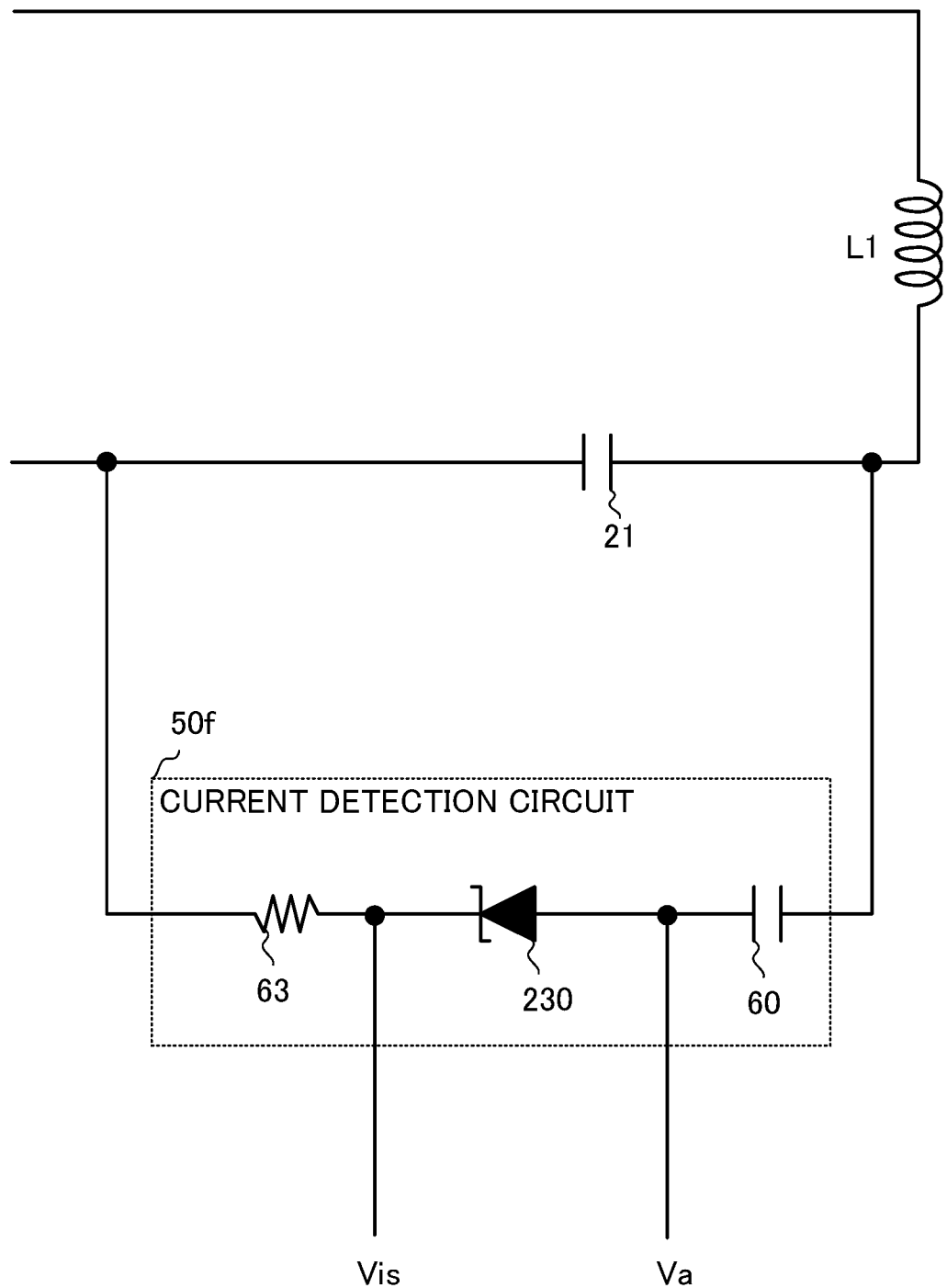
FIG. 16 is a diagram illustrating a configuration of a current detection circuit 50f.

FIG. 16 is a diagram illustrating a current detection circuit 50f, which is a sixth embodiment of the current detection circuit. Similarly to the current detection circuit 50a, the current detection circuit 50f detects the current Is obtained by dividing the resonant current, and includes the capacitor 60, the resistor 63, and a diode 230.

Here, when FIGS. 2 and 16 are compared, the current detection circuit 50f uses the diode 230, which is a Zener diode, instead of the diodes 61 and 62. In the diode 230, a forward voltage is generated when the current Is in the positive direction flows and a Zener voltage is generated when the current Is in the negative direction flows. Accordingly, with the use of the current detection circuit 50f, it is possible to increases a change in the voltage Va in the vicinity or the point at which the current Is is zero <<Control IC 55>>

Figure 17:
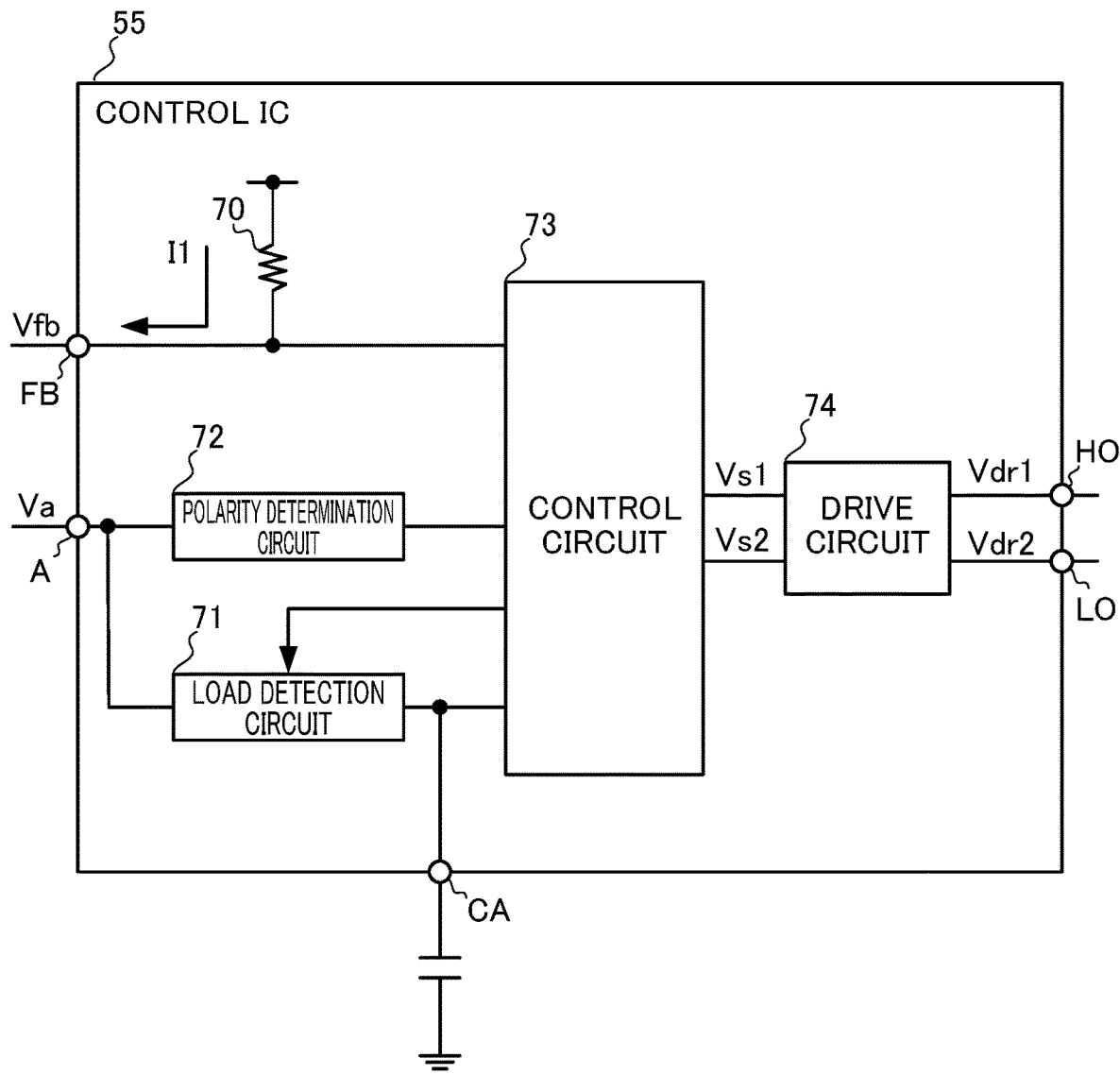
FIG. 17 is a diagram illustrating a configuration of a control IC 55.

FIG. 17 is a diagram illustrating a configuration of a control IC 55, which is another embodiment of the control IC. Similarly to the control IC 51, the control IC 55 is an integrated circuit that controls the switching of the NMOS transistors 22 and 23 in FIG. 1, and includes the terminals FB, A, CA, HO, and LO. Moreover, the control IC 55 includes the resistor 70, the load detection circuit 71, the polarity determination circuit 72, the control circuit 73, and the drive circuit 74. Here, for example, the voltage Va from the current detection circuit 50a of FIG. 2 is applied to the terminal A of the control IC 55.

Configurations (e.g., terminals, elements, and circuits) given by the same reference numerals are the same between FIGS. 5 and 17. When the control IC 55 and the control IC 51 are compared, the control IC 55 is the same as the control IC 51 except that the control IC 55 does not have the terminal IS and the voltage Va at the terminal A is applied to the load detection circuit 71. Note that the terminal A in the control IC 55 corresponds to the "first terminal" and the terminal FB corresponds to the "second terminal".

As explained in, for example, FIG. 4, when the positive current Is is flowing, the voltage Va takes a value obtained by adding the voltage Vf to the voltage Vis that changes with the load current. Accordingly, the voltage Va from the load detection circuit 71 of the control IC 55 takes a value corresponding to the load current. Thus, also in the case where the control IC 55 is used, the operation mode of the switching power supply circuit 10 can be set to the normal mode or the burst mode based on the state of the load, as in the control IC 51.

Summary

The switching power supply circuit 10 according to an embodiment of the present disclosures has been described above. The current detection circuit 50a includes the diodes 61 and and the resistor 63 that are a non-linear circuit as illustrated in, for example, FIG. 2. Accordingly, the current detection circuit 50a can more accurately detect the polarity of the current Is (i.e., resonant current) than a current detection circuit including only the resistor 63 without including the diode 61 or 62. Note that the "non-linear circuit" in an embodiment of the present disclosures is a circuit to increase a change in the voltage Va in the vicinity of the point at which the current Is is zero, and is, for example, a circuit in which a resistor and a diode that is a non-linear element are coupled to each other in series.

Further, in the current detection circuit 50a, one end of the capacitor 21 (first capacitor) and one end of the capacitor 60 (second capacitor) are coupled to each other. Moreover, in the current detection circuit 50a, the non-linear circuit provided between the other end of the capacitor 21 (first capacitor) and the other end of the capacitor 60 (second capacitor) includes the two diodes 61 and 62 and the resistor 63. However, the present disclosure is not limited thereto.

For example, the "non-linear circuit" may be configured with the one diode 230 and the resistor 63, as in the current detection circuit 50f of FIG. 16. Also in this case, the current detection circuit 50f can accurately detect the polarity of the resonant current.

Further, although, for example, the diodes 61 and 62 are provided between the capacitor 60 and the resistor 63 in an embodiment of the present disclosures, for example, a configuration may be such that the resistor 63 is coupled to the capacitor 60 and the diodes 61 and 62 are coupled to the resistor 63. However, in this case, a voltage at a node at which the resistor 63 and the capacitor 60 are coupled is inevitably affected by the diodes 61 and 62. Accordingly, in the case where the current Is corresponding the load is to be measured, it is preferable to provide the diodes 61 and 62 between the capacitor 60 and the resistor 63.

Further, in the current detection circuit 50a, the two diodes 61 and 62 are provided such that the current Is can flow in both directions. Accordingly, the waveform of the voltage Va in the case where the current Is flows in the positive direction can be made substantially the same as that in the case where the current Is flows in the negative direction.

Further, as illustrated in the current detection circuit 50c of FIG. 13, the polarity of the resonant current can be accurately detected, also in the case where the diodes 200 and 201 which are Zener diodes are used.

Further, as illustrated in the current detection circuit 50d of FIG. 14, the polarity of the resonant current can be accurately detected, also in the case where the diodes D3 and D4 that are body diodes of the NMOS transistors 210 and 211 are used.

Further, as illustrated in the current detection circuit 50e of FIG. 15, the diodes 220 and 221 which are Zener diodes may be provided in series with the diodes 61 and 62, respectively. Such a configuration can reduce the temperature dependency of the voltage Va.

Further, as illustrated in the current detection circuit 50b of FIG. 11, the resistor 64 is coupled in parallel with the diode 61. The voltage Va of the current detection circuit 50b is the value according to the current value of the current Is and the value of the combined resistance of the resistors 63 and 64. Accordingly, provision of the resistor 64 in addition to the resistor 63 enables accurate detection of the polarity of the resonant current even when the value of the resonant current is small.

Further, in the current detection circuit 50b, the resistance value R2 of the resistor 64 is greater than the resistance value R1 of the resistor 63. However, when the voltage across the resistor 64 exceeds the voltage Vf of the diodes 61 and 62, the diodes 61 and 62 are turned on, and thus no current Is flows through the resistor 64. Accordingly, the current detection circuit 50b can accurately detect the polarity of the resonant current while reducing power consumption.

Further, the control ICs 51 and 55 can reduce occurrence of off-resonance by using the voltage Va from the current detection circuit 50.

Further, the control IC 55 includes the terminal A to receive the voltage Va of the current detection circuit 50a. With the use of the control IC 55 as such, the switching power supply circuit 10 can minimize off-resonance.

Further, the load detection circuit 71 and the polarity determination circuit 72 are coupled to the terminal A of the control IC 55. Accordingly, the control IC 55 can change the operation mode of the switching power supply circuit 10 while reducing the number of terminals thereof.

Further, the control IC 51 has the terminal A to receive the voltage Va of the current detection circuit 50a and the terminal IS to receive the voltage Vis. With the use of the control IC 51 as such, the switching power supply circuit 10 can minimize off-resonance.

Further, the load detection circuit 71 is coupled to the terminal IS of the control IC 51, and the polarity determination circuit 72 is coupled to the terminal A. Accordingly, the control IC 51 can change the operation mode of the switching power supply circuit 10 while minimizing off-resonance.

Note that the comparator 101 of the polarity determination circuit 72 determines the polarity by comparing the voltage V1 and the voltage Vx of the level shift circuit 100 in an embodiment of the present disclosures, however, other circuits maybe used. For example, instead of the comparator 101, there may be used a first comparator that compares the voltage Vx and a voltage (e.g., 2.6 V) slightly higher than the voltage V1 (2.5 V) and a second comparator that compares the voltage Vx and a voltage (e.g., 2.4 V) slightly lower than the voltage V1 (2.5 V). Moreover, there may be provided a logic circuit that determines the polarity of the resonant current based on outputs from the first and second comparators.

Further, for example, the current detection circuit 50a may be configured such that multiple diodes are coupled in series with the diode 61 in the forward direction of the diode 61, and multiple diodes are coupled in series with the diode 62 in the forward direction of the diode 62. When such a circuit is used, the polarity of the resonant current can be accurately detected.

According to the present disclosure, it is possible to provide a current detection circuit capable of accurately detecting the polarity of a resonant current while reducing power consumption.

Embodiments of the present disclosure described above are simply to facilitate understanding of the present disclosure and are not in any way to be construed as limiting the present disclosure. The present disclosure may variously be changed or altered without departing from its essential features and encompass equivalents thereof.

What is claimed is:

1. A current detection circuit configured to detect a resonant current of a power supply circuit, the power supply circuit including a resonant circuit that has
   an inductor, and
   a first capacitor having a first end and a second end, the current detection circuit comprising:
   a second capacitor having a first end and a second end, the first end thereof being coupled to the first end of the first capacitor; and
   a non-linear circuit provided between the second end of the second capacitor and the second end of the first capacitor, wherein
   the non-linear circuit includes
      a first resistor having a first end and a second end, the first end of the first resistor being connected to the second end of the first capacitor, and
      a first diode and a second diode coupled in anti-parallel with each other, the first and second diodes being located between, and connected in series to, the first resistor and the second capacitor, wherein
      a cathode of the first diode and an anode of the second diode are connected to the second end of the first resistor, and
      an anode of the first diode and a cathode of the second diode are connected to the second end of the second capacitor.

2. The current detection circuit according to claim 1, wherein the first and second diodes are Zener diodes.

3. The current detection circuit according to claim 1, wherein the first and second diodes are body diodes of metal-oxide-semiconductor (MOS) transistors.

4. The current detection circuit according to claim 1, wherein the non-linear circuit further includes
   a first Zener diode coupled in series with the first diode, and
   a second Zener diode coupled in series with the second diode.

5. The current detection circuit according to claim 1, wherein the non-linear circuit further includes a second resistor coupled in parallel with the first diode.

6. The current detection circuit according to claim 5, wherein a resistance value of the second resistor is greater than a resistance value of the first resistor.

7. A power supply circuit configured to generate an output voltage of a target level from an input voltage, the power supply circuit comprising:
   a resonant circuit including an inductor, and a first capacitor having a first end and a second end;
   a first switching device and a second switching device configured to control a resonant current of the resonant circuit;
   a current detection circuit configured to detect the resonant current; and
   an integrated circuit having
      a first terminal to receive a detection voltage corresponding to the resonant current, and
      a second terminal to receive a feedback voltage corresponding to the output voltage,
   the integrated circuit being configured to control switching of the first and second switching devices, wherein
   the current detection circuit includes
      a second capacitor having a first end and a second end, the first end thereof being coupled to the first end of the first capacitor, and
      a non-linear circuit provided between the second end of the second capacitor and the second end of the first capacitor,
   the current detection circuit being configured to output a voltage from the second end of the second capacitor as the detection voltage;
   the non-linear circuit includes
      a first resistor, and
      a first diode coupled in series with the first resistor; and
   the detection voltage is a voltage of the first diode; and
   the integrated circuit includes
      a load detection circuit coupled to the first terminal, to detect a current of a load of the power supply circuit,
      a polarity determination circuit coupled to the first terminal to determine a polarity of the resonant current, and
      a control circuit configured to output signals for controlling the first and second switching devices based on the feedback voltage, a result of a detection of the load detection circuit, and a result of a determination of the polarity determination circuit.

8. The power supply circuit according to claim 7, wherein the integrated circuit further has a third terminal to receive another voltage from the first resistor.

9. A power supply circuit configured to generate an output voltage of a target level from an input voltage, the power supply circuit comprising:
   a resonant circuit including an inductor, and a first capacitor having a first end and a second end;
   a first switching device and a second switching device configured to control a resonant current of the resonant circuit;
   a current detection circuit configured to detect the resonant current; and
   an integrated circuit having
      a first terminal to receive a detection voltage corresponding to the resonant current, and
      a second terminal to receive a feedback voltage corresponding to the output voltage, the integrated circuit being configured to control switching of the first and second switching devices, wherein
the current detection circuit includes
a second capacitor having a first end and a second end, the first end thereof being coupled to the first end of the first capacitor, and
a non-linear circuit provided between the second end of the second capacitor and the second end of the first capacitor,
the current detection circuit being configured to output a voltage from the second end of the second capacitor as the detection voltage;
the non-linear circuit includes
a first resistor, and
a first diode coupled in series with the first resistor;
the detection voltage is a voltage of the first diode; and
the integrated circuit further has a third terminal to receive another voltage from the first resistor.

10. The power supply circuit according to claim 9, wherein the integrated circuit includes
a load detection circuit coupled to the third terminal, to detect a current of a load of the power supply circuit,
a polarity determination circuit coupled to the first terminal, to determine a polarity of the resonant current, and
a control circuit configured to output signals for controlling the first and second switching devices based on the feedback voltage, a result of a detection of the load detection circuit, and a result of a determination of the polarity determination circuit.

* * * * *